US011080456B2

United States Patent
Kazda et al.

(10) Patent No.: US 11,080,456 B2
(45) Date of Patent: Aug. 3, 2021

(54) AUTOMATED DESIGN CLOSURE WITH ABUTTED HIERARCHY

(71) Applicant: International Business Machines Corporation, Armonk, NY (US)

(72) Inventors: Michael Kazda, Poughkeepsie, NY (US); Harald Folberth, Boeblingen (DE); Paul G. Villarrubia, Austin, TX (US); Stephan Held, Bonn (DE); Pietro Saccardi, Bonn (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/699,085

(22) Filed: Nov. 28, 2019

(65) Prior Publication Data
US 2021/0165856 A1 Jun. 3, 2021

(51) Int. Cl.
*G06F 30/394* (2020.01)
*G06F 30/30* (2020.01)
*G06F 30/392* (2020.01)

(52) U.S. Cl.
CPC ......... *G06F 30/394* (2020.01); *G06F 30/30* (2020.01); *G06F 30/392* (2020.01)

(58) Field of Classification Search
CPC ....... G06F 30/30; G06F 30/392; G06F 30/394
See application file for complete search history.

(56) References Cited

U.S. PATENT DOCUMENTS

| | | | | |
|---|---|---|---|---|
| 6,298,468 B1 * | 10/2001 | Zhen | ............... | G06F 30/392 716/122 |
| 6,507,938 B1 * | 1/2003 | Roy-Neogi | ........... | G06F 30/392 716/113 |
| 6,567,967 B2 | 5/2003 | Greidinger et al. | | |
| 6,854,093 B1 | 2/2005 | Dahl et al. | | |
| 6,871,336 B1 * | 3/2005 | Anderson | ............. | G06F 30/392 716/122 |

(Continued)

OTHER PUBLICATIONS

Adya, S. N., & Markov, I. L. (2002). Consistent placement of macro-blocks using floorplanning and standard-cell placement. Proceedings of the 2002 international symposium on Physical design, pp. 12-17.

(Continued)

*Primary Examiner* — Jack Chiang
*Assistant Examiner* — Aric Lin
(74) *Attorney, Agent, or Firm* — Erik Johnson; Otterstedt, Wallace & Kammer, LLP

(57) ABSTRACT

To increase the efficiency of electronic design automation, execute partition-aware global routing with track assignment on an electronic data structure including a small block floorplan of a putative integrated circuit design. The small block floorplan is virtually partitioned into a proposed large block floorplan with a plurality of inter-large-block boundaries of a plurality of large blocks. Based on results of the executing, determine locations, on the inter-large-block boundaries, of a plurality of required ports corresponding to routes identified in the routing, as well as required sizes of the ports. Generate a physical partitioning based on the inter-large-block boundaries; align the ports with the inter-large-block boundaries; and generate a hardware description language design structure encoding the physical partitioning.

17 Claims, 19 Drawing Sheets

(56) References Cited

U.S. PATENT DOCUMENTS

| | | | |
|---|---|---|---|
| 7,155,693 | B1 | 12/2006 | Rodman |
| 7,562,330 | B1* | 7/2009 | Wadland ............... G06F 30/394 |
| | | | 716/129 |
| 8,271,920 | B2 | 9/2012 | Cho et al. |
| 8,375,345 | B1 | 2/2013 | Barowski et al. |
| 8,549,461 | B2 | 10/2013 | Huijbregts et al. |
| 8,762,919 | B2 | 6/2014 | Keinert et al. |
| 9,201,999 | B1 | 12/2015 | Sahni |
| 9,536,030 | B2 | 1/2017 | Fricke et al. |
| 10,055,529 | B1 | 8/2018 | Ginetti |
| 2002/0087939 | A1* | 7/2002 | Greidinger ............ G06F 30/394 |
| | | | 716/122 |
| 2006/0053396 | A1 | 3/2006 | Eng |
| 2006/0294485 | A1* | 12/2006 | Kaul ..................... G06F 30/394 |
| | | | 716/113 |
| 2007/0245281 | A1 | 10/2007 | Riepe et al. |
| 2009/0241081 | A1* | 9/2009 | Smith ................. G06F 30/3312 |
| | | | 716/113 |
| 2011/0055789 | A1* | 3/2011 | Chakanaker .......... G06F 30/394 |
| | | | 716/130 |
| 2012/0284683 | A1* | 11/2012 | Alpert .................. G06F 30/394 |
| | | | 716/129 |
| 2018/0046744 | A1 | 2/2018 | Lin et al. |

OTHER PUBLICATIONS

Cortadella, J., de San Pedro, J., Nikitin, N. et al. (2013). Physical-aware systemlevel design for tiled hierarchical chip multiprocessors. Proceedings of the 2013 ACM International symposium on Physical Design, pp. 3-10.

Hougardy et al., Dijkstra meets Steiner: a fast exact goal-oriented Steiner tree algorithm, Mathematical Programming Computation 9, No. 2 (2017), pp. 135-202.

McDermott, Early Design Planning: Front End Lecture, EE 382M-8 VLSI-2, The University of Texas at Austin, 24 pages.

Disclosed Anonymously, Enabling Back Annotation of Physical Design Optimizations into RTL hierarchical HDL designs, IP.com No. IPCOM000251161D, Oct. 19, 2017, 7 pages.

El-Zien et al., unpublished U.S. Appl. No. 15/177,560 filed Nov. 1, 2018, Pin Cloning and Subway Creation on Automatically Generated Design Physical Hierarchy, pp. 1-19 plus 5 sheets of drawings.

* cited by examiner

AUTOMATED DESIGN CLOSURE WITH ABUTTED HIERARCHY

BACKGROUND

The present invention relates to the electrical, electronic, and computer arts, and more specifically, to semiconductor Electronic Design Automation (EDA) and the like.

EDA involves the use of software tools for designing electronic systems such as integrated circuits (ICs) and printed circuit boards. One aspect of design is timing: generally, ICs have data signals and a clock; the data signal needs to reach a certain node at the correct time vis-a-vis the time when the corresponding clock cycles the device at that node. If the data signal does not arrive in time, the clock is too fast, or alternatively, the data signal is taking too long to propagate (path is too slow).

Another aspect of design is placement: based on a logical description, each component is placed, looking to minimize congestion in each area of the design. In modern very large scale integration (VLSI) designs, large parts of the design must typically be placed and optimized in a hierarchical manner. Current techniques for such physical hierarchy may have certain disadvantages, such as, for example, the need to create wiring contracts between levels of hierarchy in order to go over macros (in general, a chip may contain multiple sub-blocks termed cores, cores may be partitioned into sub-blocks termed units, and units may be partitioned into smaller sub-blocks termed macros); the need to use buffer bays to help traverse macros in order to repeat signals crossing hierarchies; and/or the need to use latch bays to help repeat pervasive signals crossing hierarchies.

When a lower level piece of hierarchy is required to be crossed, current techniques typically leave a "cutout" or buffer bay to add a repeater later at the upper level of hierarchy. Similarly, if there is not enough porosity of a given wiring layer, a wiring contract is established between the two layers. These aspects of the prior art tend to solidify the designs early-on and prohibit changes that may be more efficient, thereby disadvantageously freezing hierarchies of the design.

SUMMARY

Principles of the invention provide techniques for automated design closure with abutted hierarchy. In one aspect, an exemplary method for increasing the efficiency of electronic design automation includes executing partition-aware global routing with track assignment on an electronic data structure including a small block floorplan of a putative integrated circuit design, the small block floorplan being virtually partitioned into a proposed large block floorplan with a plurality of inter-large-block boundaries of a plurality of large blocks; based on results of the executing, determining locations, on the inter-large-block boundaries, of a plurality of required ports corresponding to routes identified in the routing, as well as required sizes of the ports; generating a physical partitioning based on the inter-large-block boundaries; aligning the ports with the inter-large-block boundaries; and generating a hardware description language design structure encoding the physical partitioning.

In another aspect, an exemplary computer includes a memory; and at least one processor, coupled to the memory, and operative to increase the efficiency of electronic design automation by: executing partition-aware global routing with track assignment on an electronic data structure including a small block floorplan of a putative integrated circuit design, the small block floorplan being virtually partitioned into a proposed large block floorplan with a plurality of inter-large-block boundaries of a plurality of large blocks; based on results of the executing, determining locations, on the inter-large-block boundaries, of a plurality of required ports corresponding to routes identified in the routing, as well as required sizes of the ports; generating a physical partitioning based on the inter-large-block boundaries; aligning the ports with the inter-large-block boundaries; and generating a hardware description language design structure encoding the physical partitioning.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. For example, one or more embodiments provide one or more of:

an abutted (soft) hierarchy that removes obstacles from traditional planning and construction;

virtual large block partitions that can use the entire metal stack without contracting wiring;

buffer and latch bays are not required to repeat signals during planning;

automated generation of construction components (for hLBS (Hierarchical Large Block Synthesis)), including place and route (PR) boundary, port assignment) and/or out of context (OOC) timing assertions for hLBS;

automated feedthrough generation with a global perspective;

enablement of power reduction through area reduction (by favoring high usage of hLBS);

enablement of physical design (PD) team to iterate on multiple design hierarchies without need for logic support; and enablement of alternate floorplan evaluation (physical design exploration).

These and other features and advantages of the present invention will become apparent from the following detailed description of illustrative embodiments thereof, which is to be read in connection with the accompanying drawings.

DETAILED DESCRIPTION

One or more embodiments advantageously provide techniques to automate pin assignment, timing assertion, and feedthrough generation for abutted hierarchies. These techniques find legal (non-overlapping) port locations for partitions through bottoms up traversal of global routes on a small block floorplan, using a partition-aware, timing-aware global router to minimize crossings on partitions. The methodology generates new hardware description language (HDL) files, abstract files, and timing assertion files for abutted hierarchies.

In modern VLSI designs, large parts of the design must typically be placed and optimized in a hierarchical manner. Accordingly, a flat design will ideally be split into different logical and physical partitions. These partitions will then be optimized in parallel and independent of each other. The design is often created in a high level description language (e.g., VHDL (VHSIC-HDL) (Very High Speed Integrated Circuit Hardware Description Language)) with a logical hierarchy description. This logical hierarchy description should have a physical hierarchy description that implements its function in terms of fitting each desired function to physical requirements that can be placed and routed to meet the timing constraints.

The design team typically starts with a bottoms-up approach implementing the small parts of the hierarchy and fitting them into larger partitions which are meant to fit into the core (of a microprocessor). The bottoms-up approach creates a small block floorplan. One pertinent challenge is to physically construct larger partitions which enclose the small blocks which are compacted (optimized for place and routing) through an hLBS (Hierarchical Large Block Synthesis) place and route methodology. These larger partitions typically require pin assignment and feedthrough generation such that the design flow is convergent. Routing at the top level of hierarchy is desired to be straight and non-detoured to achieve high-performance timing goals.

Figure 1:
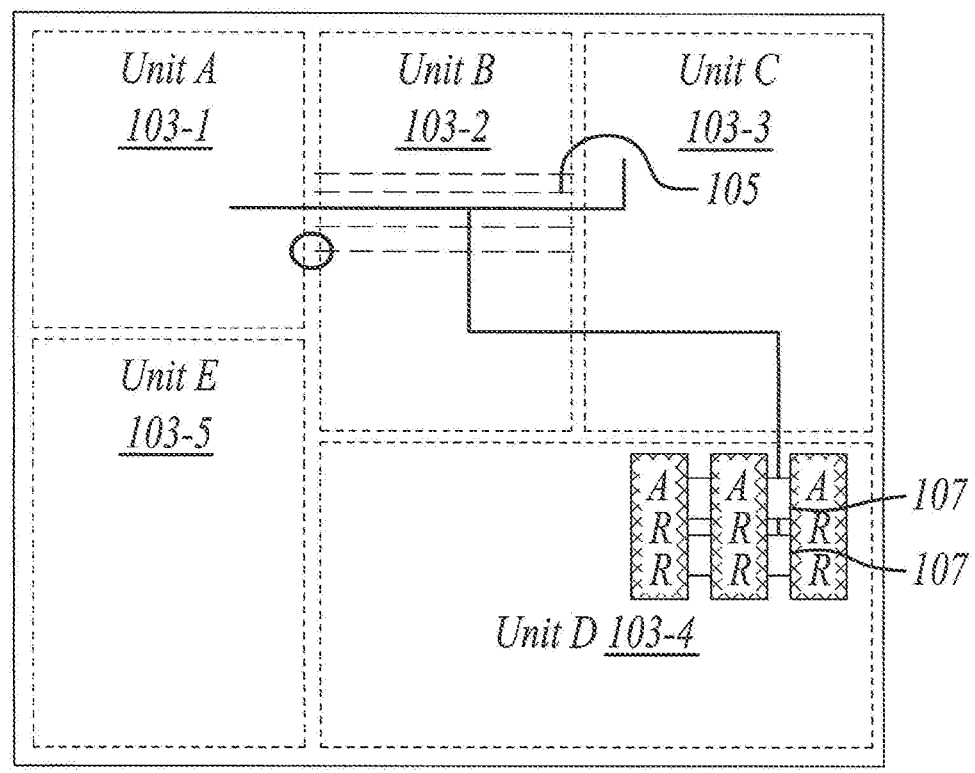
FIG. 1 shows a physical hierarchy in accordance with the prior art.

Referring to FIG. 1, current techniques for physical hierarchy employ a "hard" hierarchy, wherein design units are subdivided down as core 101, unit (e.g. 103-1, 103-2, 103-3, 103-4, 103-5), and RLM (random logic macro) with hard boundaries. A random logic macro is typically synthesized logic using a standard cell library; layout is performed with automated place and route tools. The core has units, and units have RLMs. To avoid clutter, the RLMs are not shown in FIG. 1, but an example net is shown starting in unit 103-1, traversing unit 103-2, and ending in units 103-3 and 103-4. The "hard" hierarchy introduces obstacles that are difficult to work around. The design team typically must create wiring contracts 105 between levels of hierarchy in order to go over macros, must use buffer bays 107 to help traverse macros in order to repeat signals crossing hierarchies; and/or must use latch bays (omitted from FIG. 1 to avoid clutter; the skilled artisan is familiar with latch bays) to help repeat pervasive signals crossing hierarchies.

Suppose the wiring stack is arranged as follows from lowest to highest layers: Mx, Cx, Kx, Hx. At the top level of the core 101, route on Hx layers. The RLMs below Unit B 103-2 can only use up to the K layer (cannot touch H). The Unit B uses H to route across, but beneath that layer of the physical hierarchy, there are lower blocks' RLMs. If the RLMs going in and out of Unit B (or even within Unit B from RLM to RLM contained therein), cannot complete routing (run out of resources), then part of Hx can be "opened up" to the lower levels of hierarchy (RLMs). Thus, some blockage goes to the parent and some to the child to subdivide the H layers between those levels of hierarchy. The wiring channels are limited and if they are all used up in one layer of hierarchy, and not in another, then they can be divided/shared.

Figure 2:
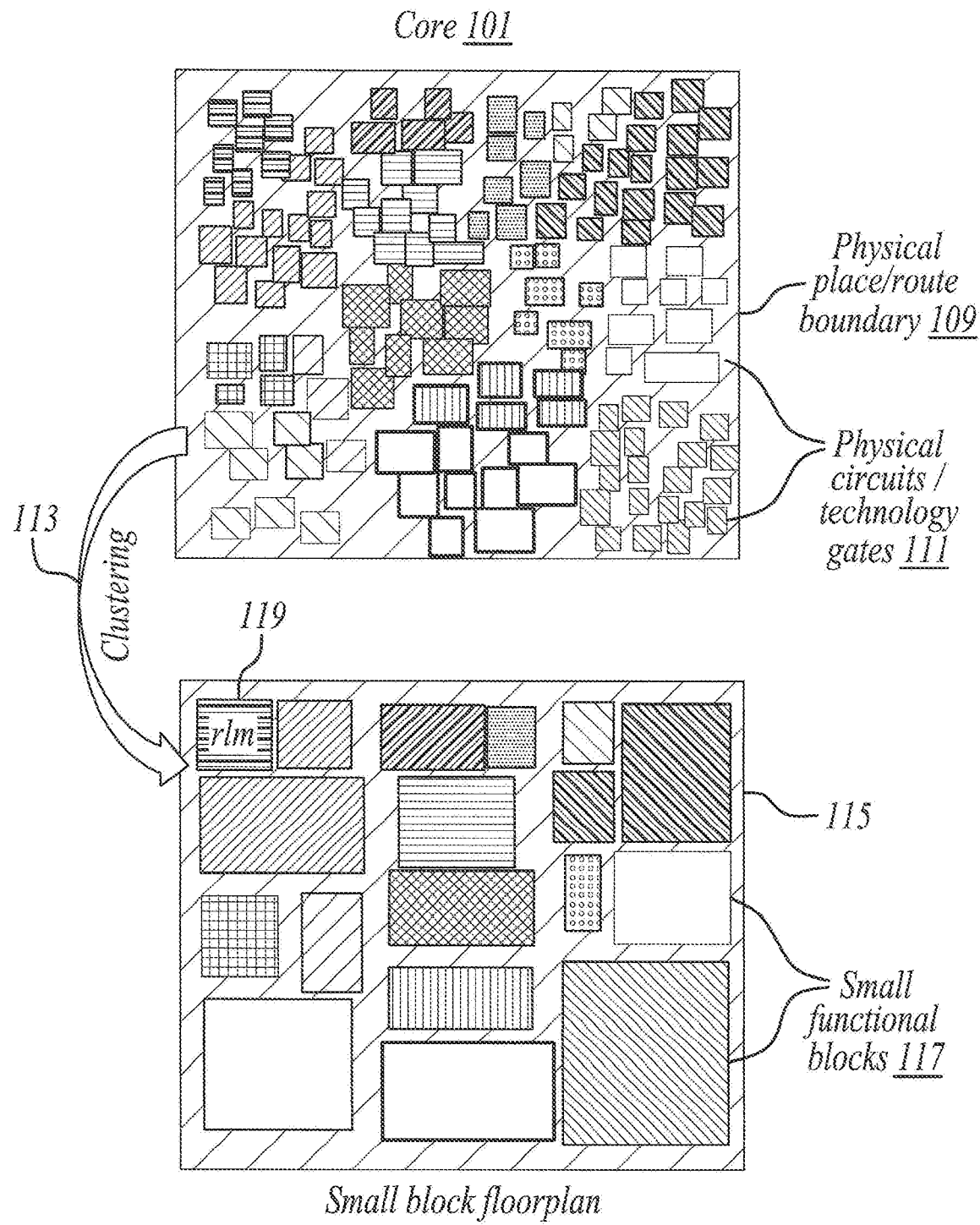
FIG. 2 shows small block floorplan creation as in an embodiment of the invention.

Referring now to FIG. 2, at the lowest level of the hardware description language (HDL) description, physical representations are created and sized accordingly based on notions which can be placed and routed. The entire design can be flattened down to the leaf technology gates. The design is legally placed with a clustering that maintains the logical function from the HDL. The design is placed as tightly as possible to enable routing based on the given technology rules. From the flattened circuit representation, the small block place and route boundaries are extrapolated, and a small block floorplan is produced. In particular, the core 101 is defined by physical placement/routing boundary 109, and includes various physical circuits and/or technology gates 111. The clustering process 113 results in small block floorplan 115 with small functional blocks 117 including RLM 119.

Figure 3:
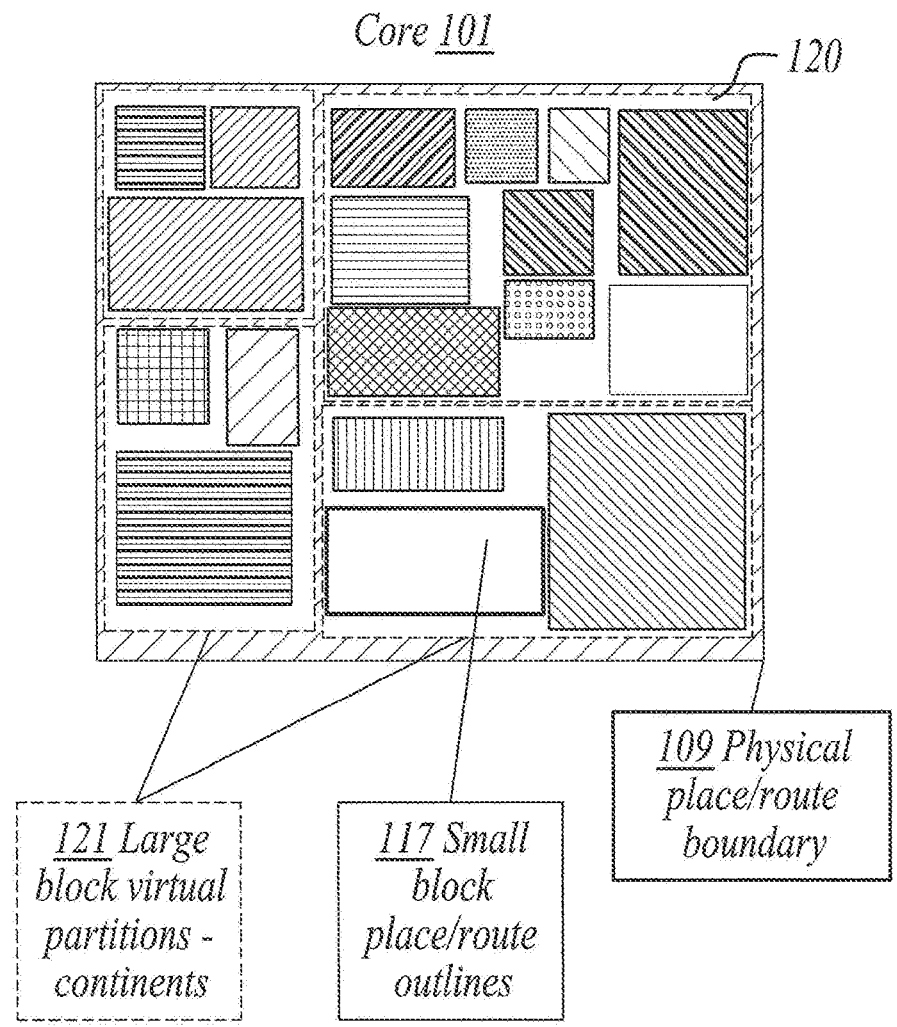
FIG. 3 shows a large block abutted hierarchy in accordance with the prior art.

With attention now to FIG. 3, consider a large block abutted hierarchy. Using the small block floorplan, virtual partitions 121 are proposed for a large block floorplan (also called continents). These large virtual partitions can be fully abutted, as shown, or partially abutted, leaving space at the top level of the hierarchy. In some instances, large block partitions use the hLBS process to achieve a high degree of area compaction to reduce power. Timing and routing congestion are checked against this to verify meeting those constraints. FIG. 3 is an analog to FIG. 1. The partitions are the units. However, the two figures do not correspond exactly because two north units (Unit B 103-2 and Unit C 103-3) are merged into a single unit 120 in FIG. 3. These are two different physical hierarchies, as a non-limiting example.

Figure 4:
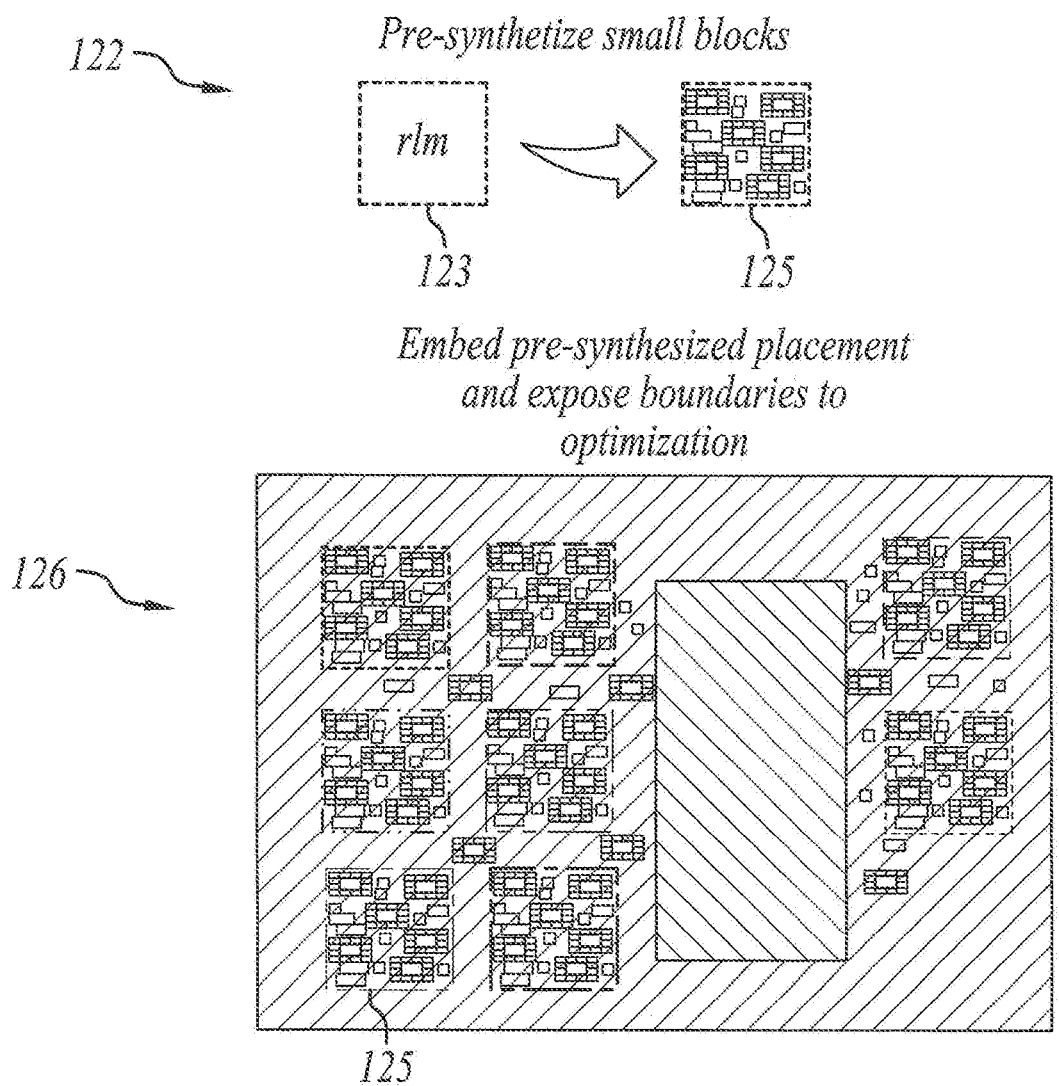
FIG. 4 shows hierarchical large block synthesis in accordance with the prior art.

Referring now to FIG. 4, heretofore, hLBS has been used to construct large blocks. This achieves tight area compaction, power reduction, and timing closure. In this process, typically, pre-synthesize children macros (small blocks) and solve latch to latch paths; load top-level; import pre-synthesized children in place (preplaced); expose boundaries of children to optimization, hide internals; and carry out placement and timing closure with route-ability estimation.

View 122 shows a random logic macro 123 being pre-synthesized into small blocks at 125. The pre-synthesized placement is then embedded and the boundaries exposed to optimization, as seen at view 126.

Figure 5:
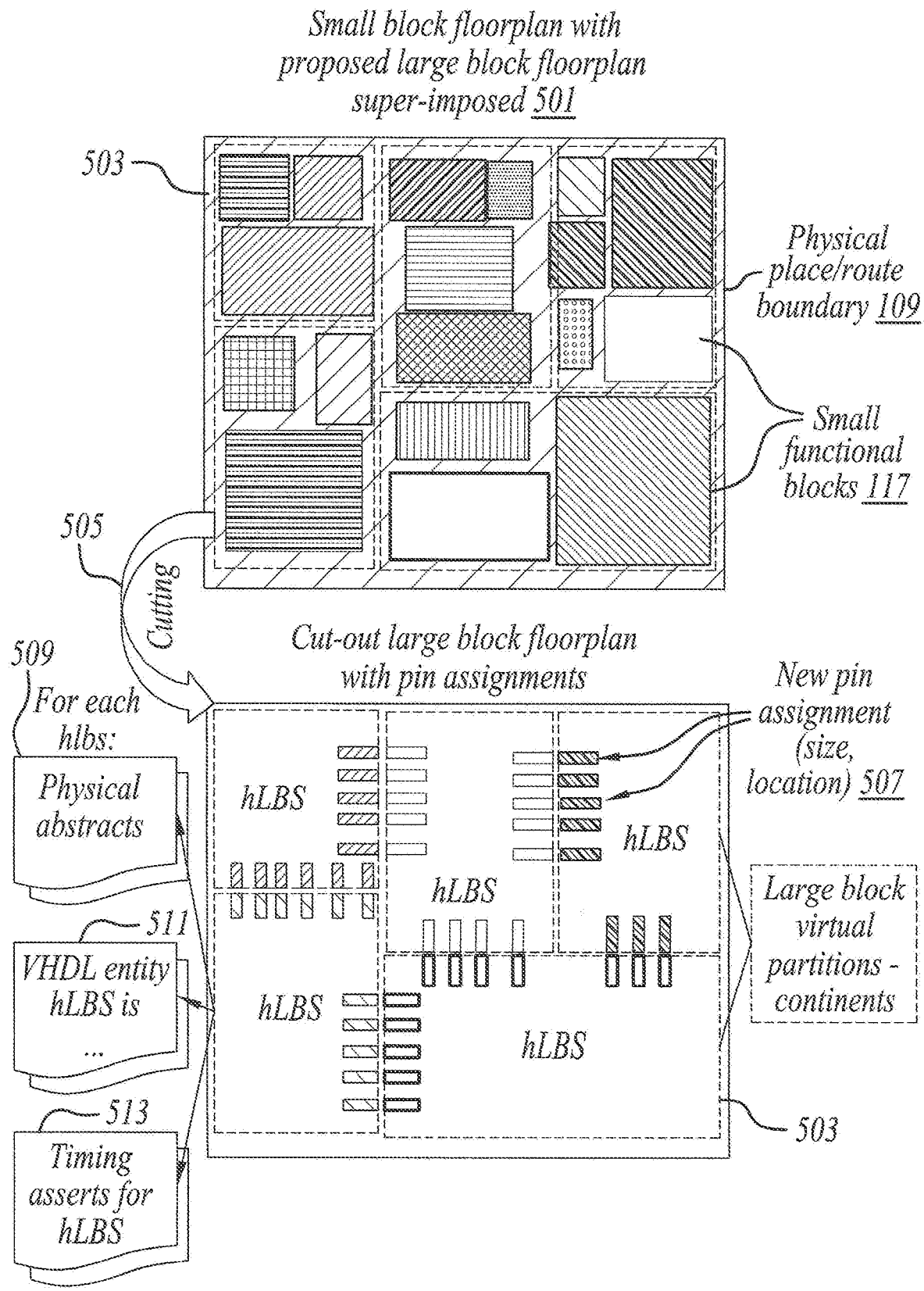
FIG. 5 shows a "cutting" process wherein a small block floorplan with proposed large block floorplan super-imposed is transformed to a cut-out large block floorplan with pin assignments, according to an aspect of the invention.

With attention now to FIG. 5, one or more embodiments take as inputs top-level VHDL, the small block floorplan from the prior planning step, and a proposed large block floorplan; and output large block physical partitions (continents) with pin assignment enabling abutted routing (abstracts), an HDL logic description for large block physical partitions; and timing assertions for large block physical partitions (continents). One or more embodiments advantageously optimize port location and size, providing legally sized and placed pin assignment for all large block partitions at the boundary. One or more embodiments optimize net and feedthrough topology, providing "no zig-zag" routing, straight abutment routes at the second level hierarchy, and/or ensuring that nets that end in a partition do not go out and back into the same partition on the same signal net. One or more embodiments perform slack distribution for timing assertions and/or generate directives in an aspect-oriented design tool for generating new continent VHDL. Such a tool can, for example, use HDL language processing to transform hierarchies; for example, to transform from a logical hierarchy into a different physical hierarchy. Such a tool provides the ability to rewrite the VHDL. It provides instructions to direct when to 1) create a level of hierarchy, 2) move a block from one level of hierarchy to another level of hierarchy, and 3) create a connection (physical connection) between levels of hierarchy. As an example, start with one large "blob" of VHDL. Construct directives for the hierarchy transformation and feed same into the process. That process will output several new pieces of VHDL for those "new" physical hierarchies. That subsequent VHDL is then used to construct the physical design and proceed with the rest of the design process (actual place and routing that will go to manufacturing). One or more embodiments described herein are directed to "planning" for the construction.

Note at 501 a small block floorplan with a proposed large block floorplan (dotted lines 503) super-imposed thereon. Elements 109,117 are as described above. In cutting process 505, cut out the large block floor plan 503 which includes a number of large bock virtual partitions (continents) obtained via hLBS. As indicated at 507, each has a new pin assignment in terms of size and/or location. Each hLBS has data including physical abstracts 509, VHDL entity 511, and timing assertions 513.

Figure 6:
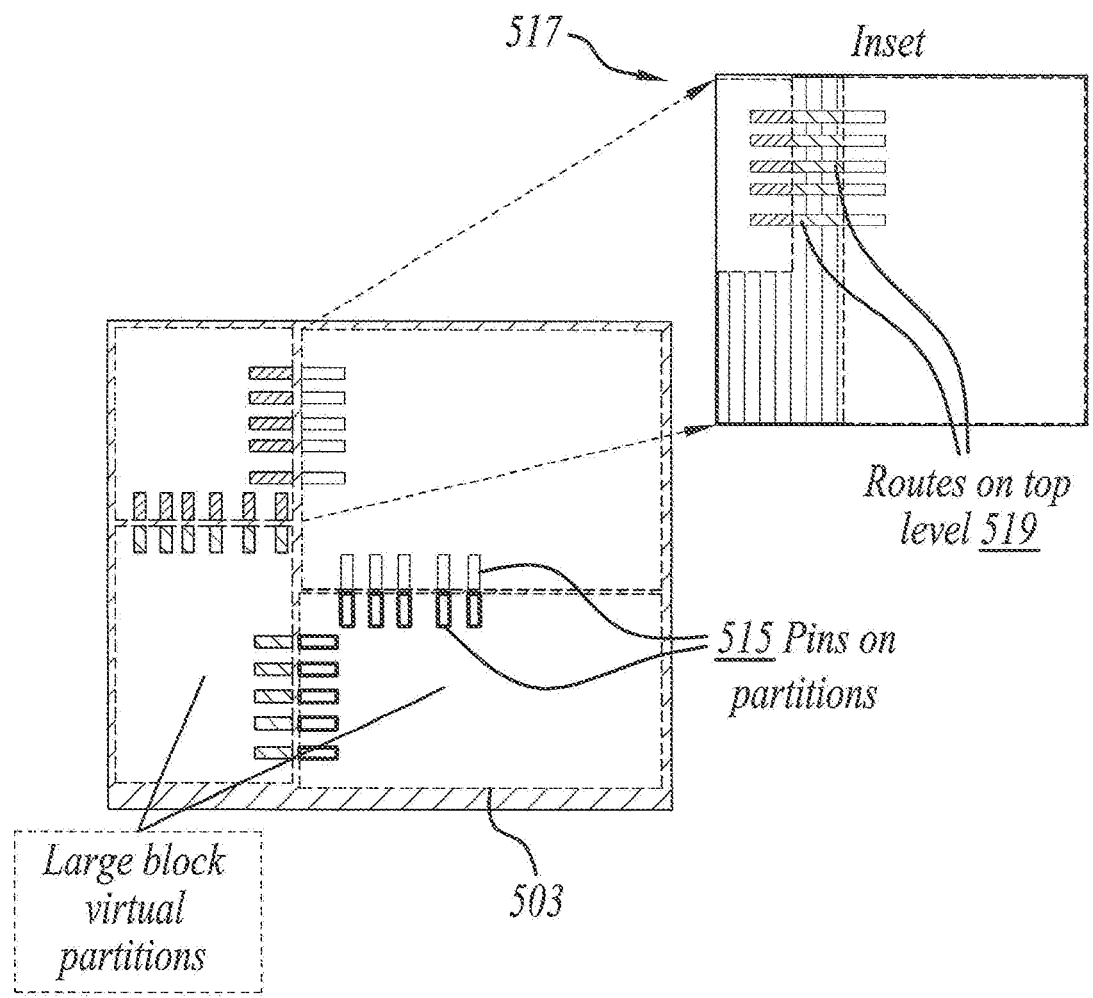
FIG. 6 shows abutment routing, according to an aspect of the invention.

FIG. 6 shows abutment routing. The abutted partitions enable straight routing paths. In one or more embodiments, ease of use is provided for the second level hierarchy routing problem; there is no contention; and no need to buffer/repeat signals at the top layer of the hierarchy. Note the pins 515 on the partitions and the detailed view at 517 showing the top-level routing 519. In one or more embodiments, the routes at the abutment level contain no circuits (no buffers/repeaters). The gap will be either non-existent if the pins between partitions actually touch (intersect), or the gap will be small enough that a repeater is unnecessary; it is a wire only level.

Figure 7:
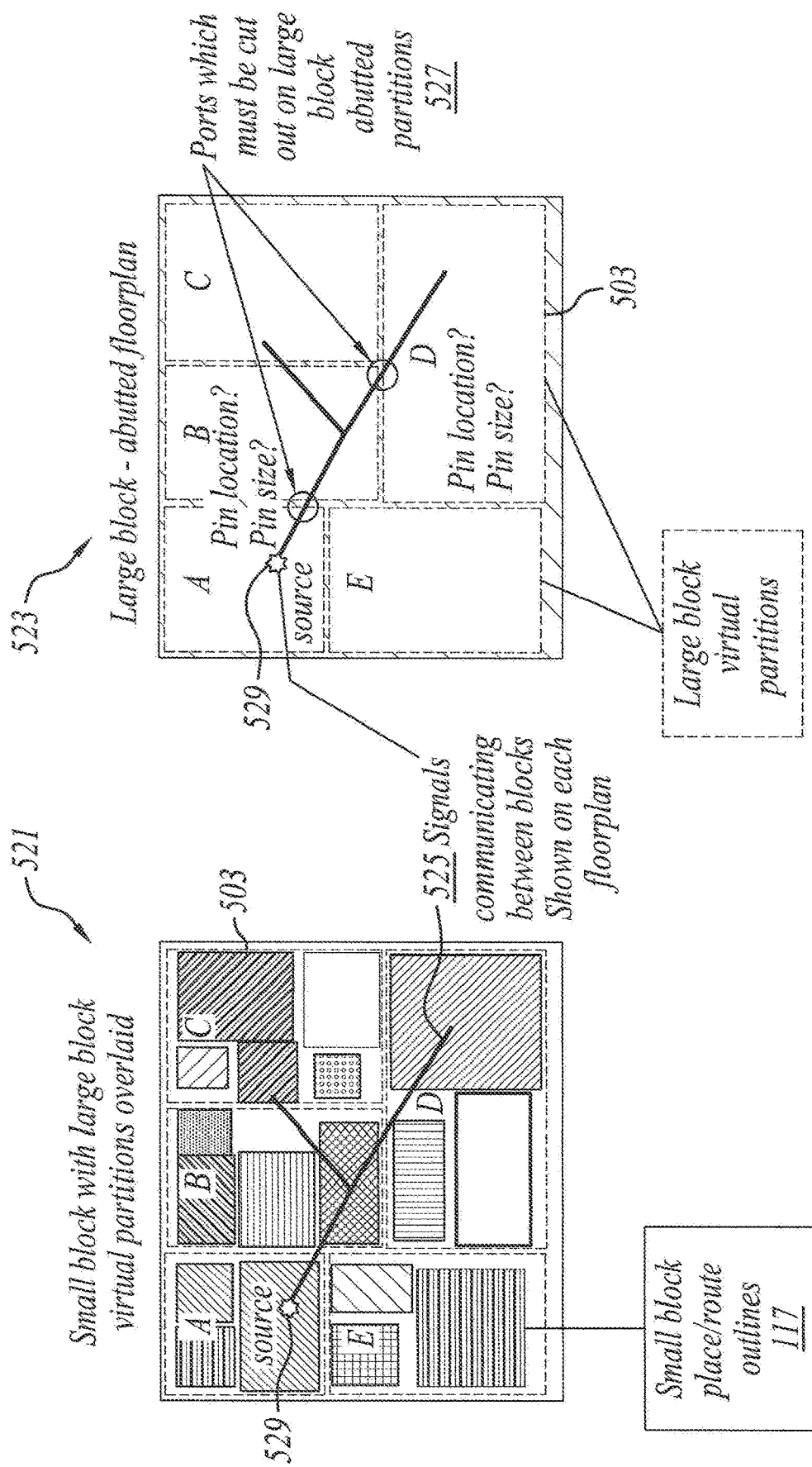
FIG. 7 shows pin assignment on a large block abutted floorplan, to be addressed by FIG. 8.

FIG. 7 shows aspects of pin assignment on a large block abutted floorplan. FIG. 7 in essence shows "what is planned" for FIG. 8: "here is the connectivity, but it is unknown where to place those pins without a further step." View 521 shows the small blocks 117 with large block virtual partitions 503 overlaid thereon. View 523 shows the corresponding large block abutted floorplan with large block virtual partitions. In views 521 and 523, lines 525 represent signals communicating between blocks. Locations 527 denote ports which must be cut out on the large block abutted partitions. Note in each view the source 529 and note in view 523 that the pin locations and size associated with each port are to be determined.

Figure 8:
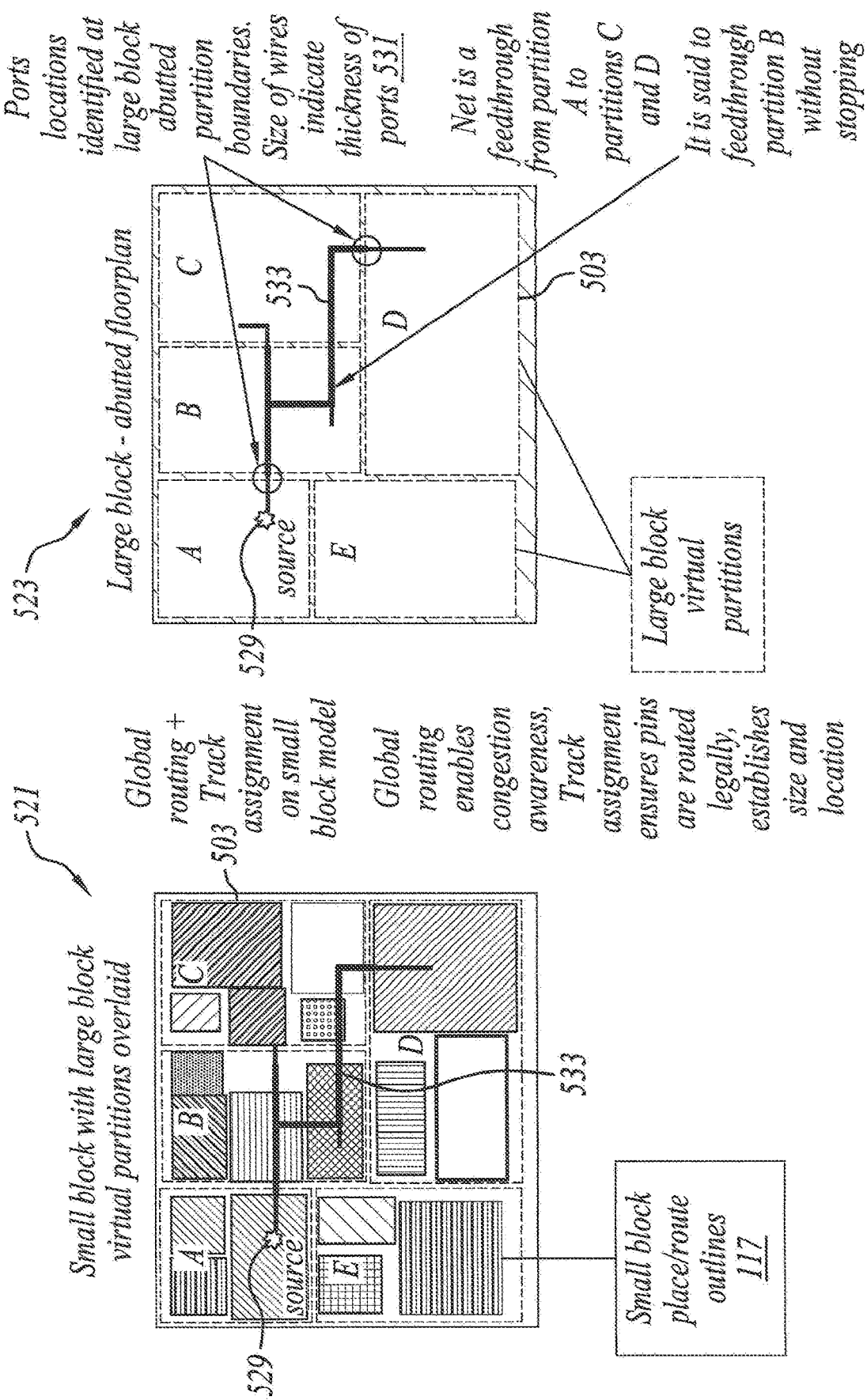
FIG. 8 shows use of timing-constrained global routing and track assignment to establish large block port locations and sizes on the floorplan of FIG. 7, according to an aspect of the invention.

With attention to FIG. 8, one or more embodiments address the pin assignment problem by using timing-constrained global routing and track assignment to establish large block port locations and sizes. Global routing and track assignment is carried out on the small block model. Global routing enables congestion awareness, while track assignment ensures pins are routed legally, and establishes size and location. As seen at 531, port locations are identified at large block abutted partition boundaries. The size of wires indicate the thickness of the ports. Net 533 is a feedthrough from partition A to partitions C and D; it is the to feed through partition B without stopping.

Figure 9:
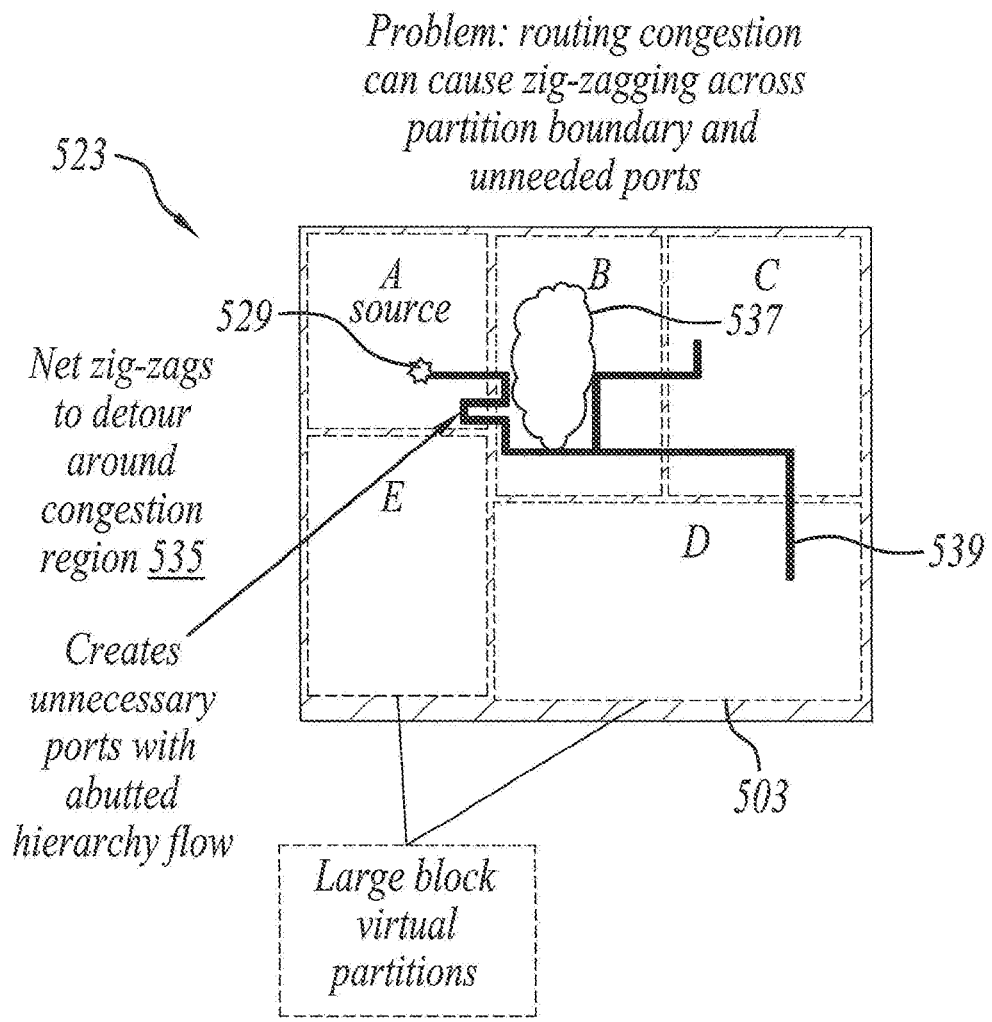
FIG. 9 shows reduction of undesirable "zig-zag" routing, according to an aspect of the invention.

Referring to FIG. 9, as seen at 535, routing congestion (symbolized by cloud 537) can cause zig-zagging across partition boundaries and unneeded ports. The net zig-zags to detour around the congestion region, which creates unnecessary ports with abutted hierarchy flow. The overall zig-zagged route is designated as 539. One or more embodiments address this issue via penalized costs during a multi-commodity flow algorithm. Costs are assigned during the global route resource-sharing algorithm to prevent routes from zig-zagging across partition boundaries. Traversing from the sink to the source along a route, every time that a border is crossed outwardly and then the route goes back in (zig-zagging) is penalized with a high cost. Costs are dynamically updated through the global routing process. The higher the cost, then the multi-commodity flow algorithm will penalize this case and choose a "cheaper" method. Therefore, a subsequent phase of global routing would be forced to route this before other nets and therefore, help avoid detouring against the edge of the partition. Thus, in one or more embodiments, the router is made to be partition-aware (or "continent-aware"). It will eliminate extra crossings that would create going into and out of the same partition multiple times (by the high cost). It will prevent what are known as "short" subways which may cross an edge of a partition needlessly to get from one partition to another (can be visualized by thinking of a corner of the rectangle defining the partition). Furthermore, the router can be guided per net to follow a given pathway. A file describing a list of nets and either a partition to allow entering or forbid from entering can be provided. An example of this file format in JSON (JavaScript Object Notation) is set forth below:

```
[
  {"netset": ["TOP@@SD_COMP_NET"],
  "allowed":   ["UNIT_A",   "UNIT_B",   "UNIT_C",
     "UNIT_D"],
  "forbidden": [ ]
  },
  {"netset": ["TOP@@LSU_ACC(0)"],
  "allowed": ["UNIT_B", "UNIT_C", "UNIT_D"],
  "forbidden": [ ]
  },
  {"netset": ["TOP@@SD_COMP_LTAG(1)"],
  "allowed":[ ],
  "forbidden": ["UNIT_E"
  },
  {"netset": ["TOP@@SD_COMP_LTAG(2)"],
  "allowed":[ ],
  "forbidden": ["UNIT_F", "UNIT_B"]
  }
]
```

Figure 10:
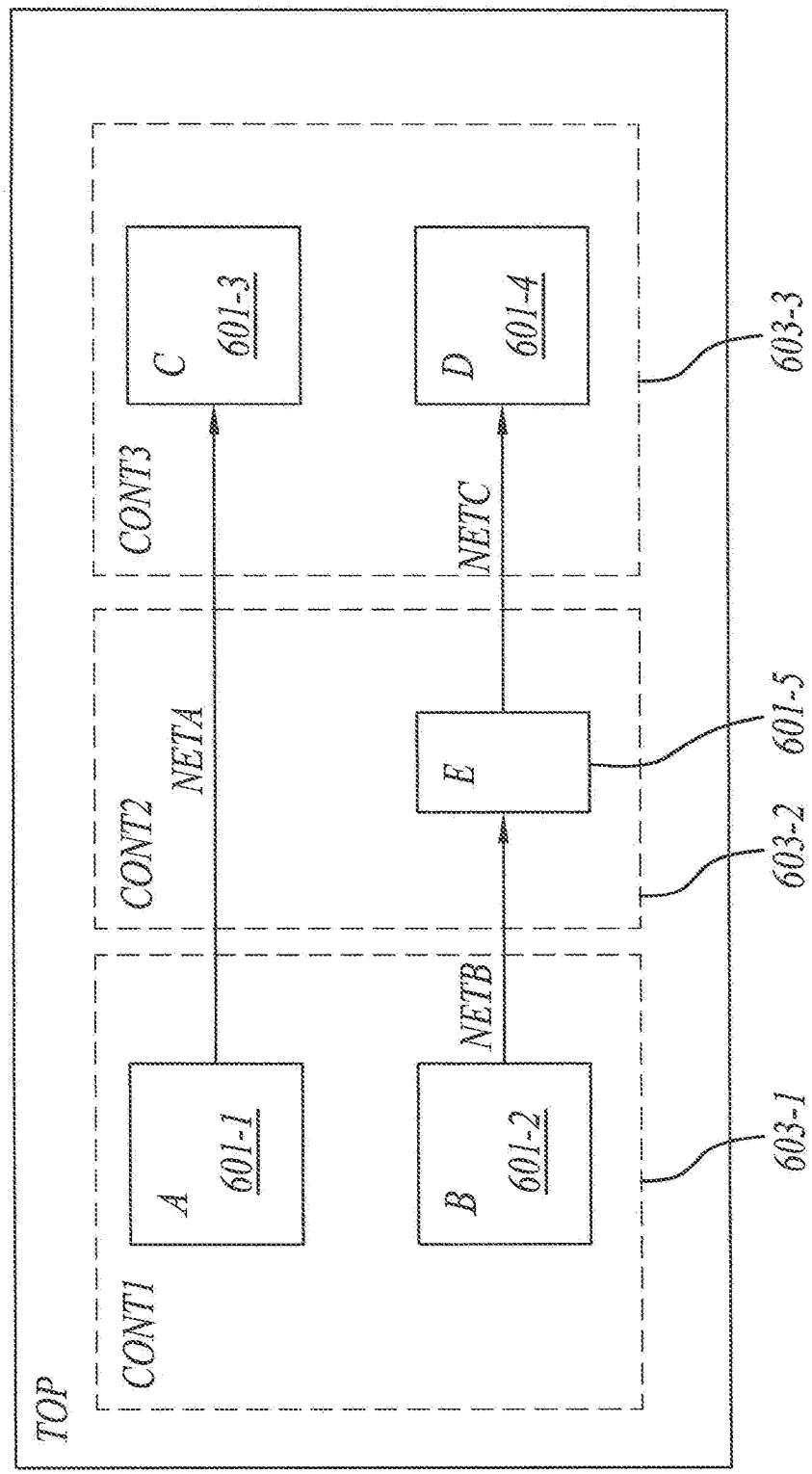
FIG. 10 shows movement of small-block macros into large-blocks, according to an aspect of the invention.
Figure 11:
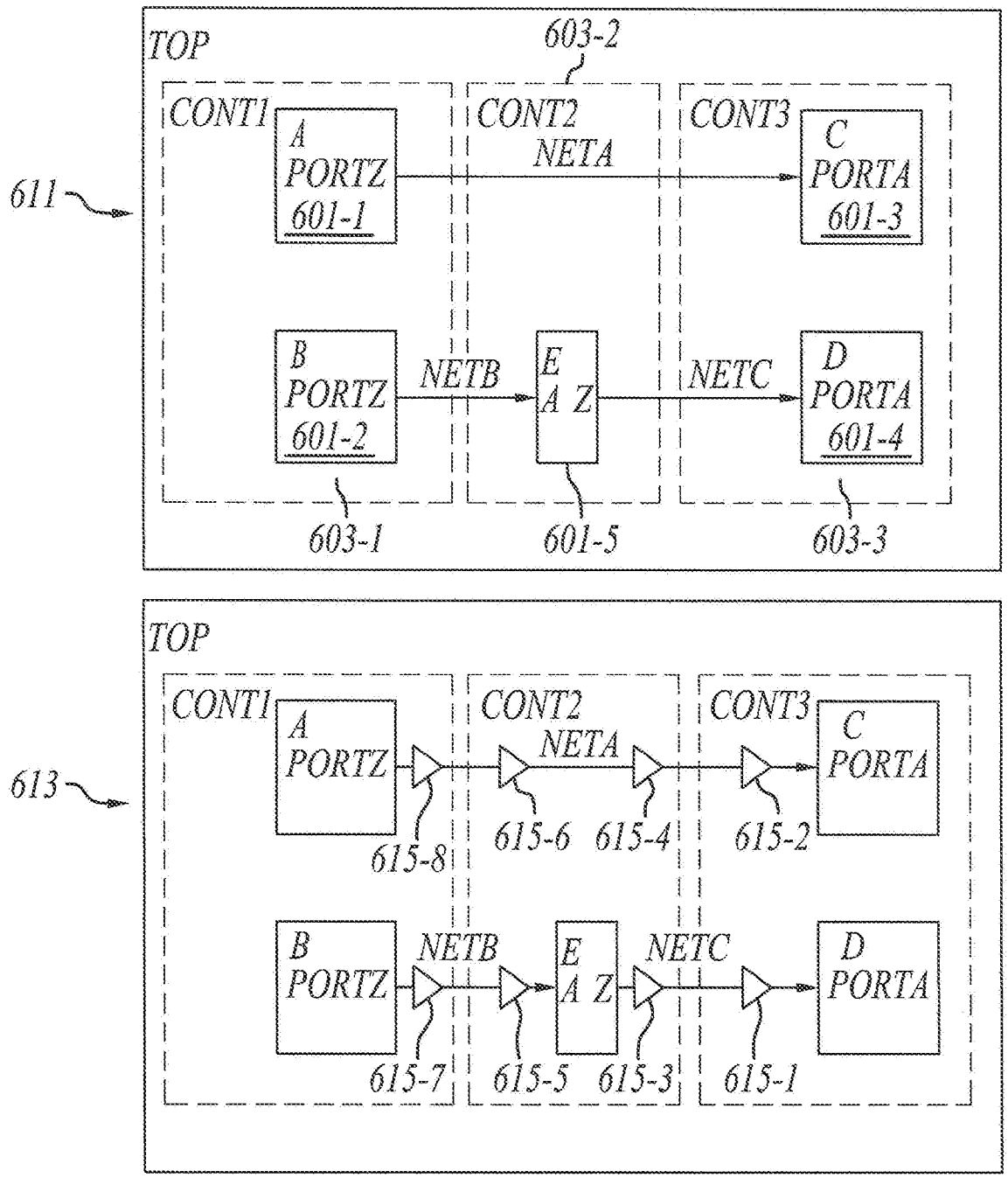
FIG. 11 shows connectivity assignment for the small-block macros of FIG. 10, according to an aspect of the invention.

As seen in FIG. 10, in one or more embodiments, small block macros are moved using an aspect-oriented design tool as discussed above, via directives which assign small blocks to continents. FIG. 10 depicts different levels of hierarchy for the VHDL and how the aspect-oriented design tool will transform from one representation to another. Conceptually, start on the top-level VHDL and the boxes A, B, C, D, E respectively numbered 601-1, 601-2, 601-3, 601-4, 601-5 are present. There is a directive ("proto") that creates the dashed line partitions CONT1, CONT2, CONT3 respectively numbered 603-1, 603-2, 603-3. A second directive ("move") instruction moves each of the boxes 601-1, 601-2, 601-3, 601-4, 601-5 into the dashed line partitions. For example, move A 601-1 into CONT1 603-1, move B 601-2 into CONT2 603-2. In particular, the dashed lines represent a new level of hierarchy being created. This can be represented by the proto command as follows:
    proto hier_name;
The move command is illustrated below:
    move block_name hier_name/new_block_name;
The new_block_name can be an equals sign to denote no change in the name of the block_name. The following are exemplary commands that go along with FIG. 10:
    proto CONT1;
    proto CONT2;
    proto CONT3;
    move A CONT1/=;
    move B CONT1/=;
    move C CONT3/=;
    move E CONT2/=;
    move D CONT3/=;
FIG. 11 shows how the connectivity of the new VHDL hierarchy will be transformed from prior FIG. 10. The top 611 of FIG. 11 is a repeat of FIG. 10 but with net names and port names specified. The bottom 613 conveys another directive (pclone, or physical clone) that virtually places a circuit represented by the buffer notation (triangle) 615-1, 615-2, 615-3, 615-4, 615-5, 615-6, 615-7, 615-8 at the boundaries of the dashed-line partitions. Partitions 603-1, 603-2, 603-3 and boxes 601-1, 601-2, 601-3, 601-4, 601-5 are present at 613 as well as 611 but are not numbered at 613 to avoid clutter. Each of these pclone directives is a new name, what net from the top-level of hierarchy to transform, and a list of sinks (where they stop). For these aspect-oriented design tool directives, a new physical hierarchy can be constructed: (i) proto directive—creates a new level of hierarchy, (ii) move instruction—moves a box from one level of hierarchy to another level, and (iii) pclone instruction—transforms the net from one level of hierarchy to the lower levels of hierarchy. In particular, each triangle represents a pclone statement. The pclone statement is illustrated below.
    pclone subway_name=net_name:sink_list
The sink_list is one or more sink pin locations or a subway_name. The pclone commands can "chain."
The following are exemplary commands that go along with FIG. 11:
    pclone subway TOP:PAN_CONT3_0_0_NETC=NETC:D/PORTA;
    pclone subway TOP:PAN_CONT3_0_0_NETA=NETA:C/PORTA;
    pclone subway TOP:PAN_CONT2_0_0_NETC=NETC:PAN_CONT3_0_0_NETC;
    pclone subway TOP:PAN_CONT2_1_0_NETA=NETA:PAN_CONT3_0_0_NETA;
    pclone subway TOP:PAN_CONT2_0_0 NETB=NETB:E/A;
    pclone subway TOP:PAN_CONT2_0_0 NETA=NETA:PAN_CONT2_1_0_NETA;
    pclone subway TOP:PAN_CONT1_0_0_NETB=NETB:PAN_CONT2_0_0_NETB;
    pclone subway TOP:PAN_CONT1_0_0_NETA=NETA:PAN_CONT2_0_0_NETA;

Consider timing assertion generation. One or more embodiments generate timing and electrical assertions such that: top-level timing is met if all units meet their timing constraints and subway nets are always feasible. In one or more embodiments, negative slack is distributed to the source and sink continents only, and positive slack is distributed along continents proportional to the delay. In one or more instances, generated assertion files for each continent include:
    pis files (primary input specification)—arrival times and input slews for input ports
    eta files (expected time of arrival)—required arrival times for output ports
    slew limit files (transition time limits)—slew limits at output ports
    picap files (primary input cap)—capacitance limits at input ports
    pincap/pos files (primary output pin cap/primary output spec)—capacitance at output ports.
One or more embodiments make use of virtual timing; however, this does not preclude other timing models in other embodiments.

Figure 12:
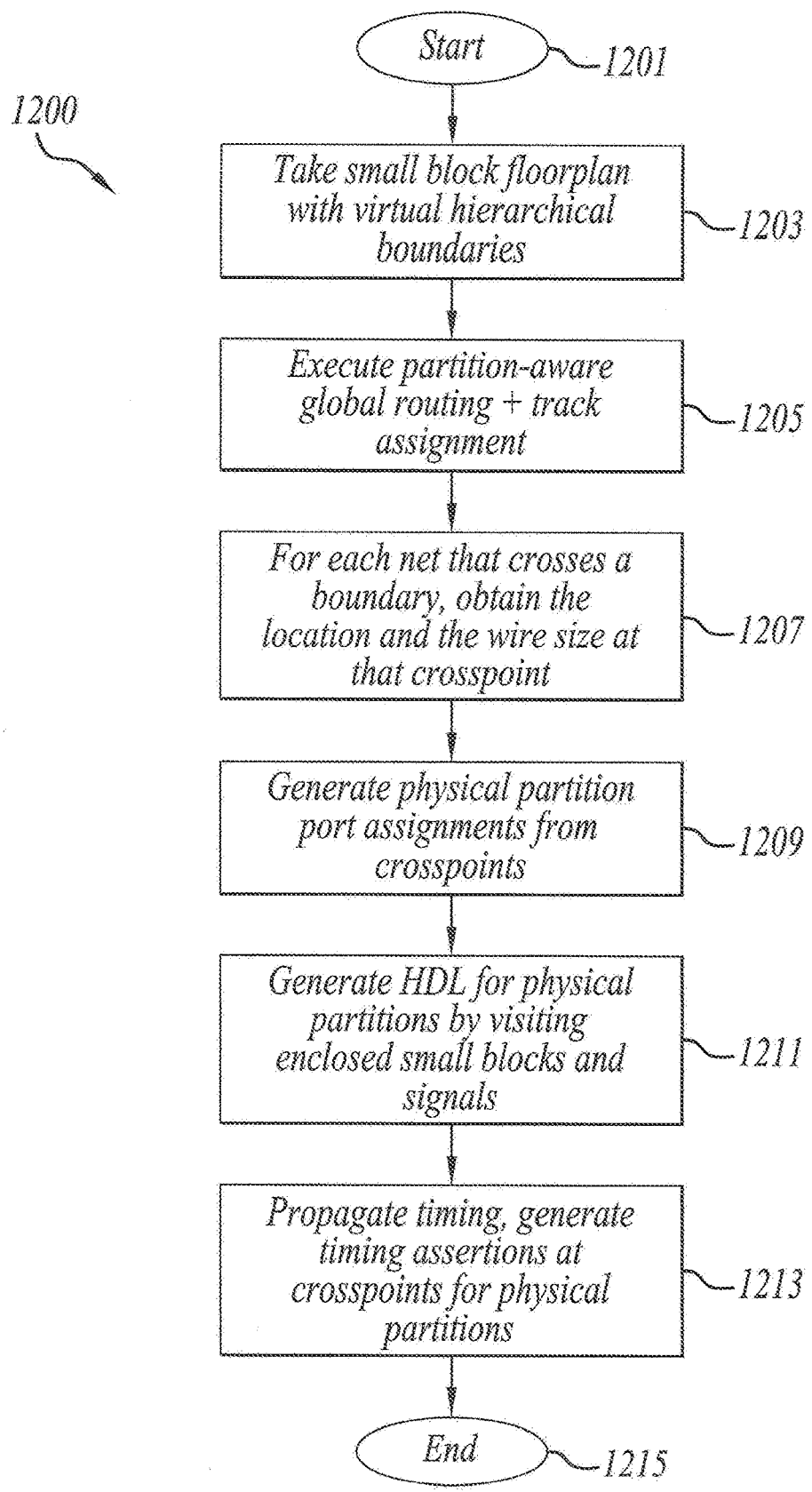
FIG. 12 is a flow chart of an exemplary method, according to an aspect of the invention.

Refer now to the flow chart 1200 of FIG. 12, which begins at 1201. In step 1203, obtain data for a small block floorplan with virtual hierarchical boundaries (also referred to as virtual partitions). In step 1205, execute partition-aware global routing and track assignment. In step 1207, for each net that crosses a virtual partition boundary, obtain the location and the wire size at that crosspoint. The term "crosspoint" refers to the location where the net crosses the virtual partition boundary. One or more embodiments examine the global route at that position, and use the size of the wire and the metal layer to determine the size and layer of the port to construct on the new physical hierarchy boundary. In step 1209, generate physical partition port assignments from the crosspoints. In step 1211, generate HDL for the physical partitions by visiting enclosed small blocks and signals. In step 1213, propagate timing, and generate timing assertions at crosspoints for physical partitions. Processing concludes at 1215.

One or more embodiments employ virtual partition-aware (continent-aware) global routing and track assignment enabling port creation on virtual partitions and timing assertion generation. In one or more embodiments, a resource sharing algorithm dynamically updates costs to prevent nets from entering and leaving the same partition. One or more instances provide physical design-to-VHDL mapping for partition VHDL generation, with mapping back to the source VHDL through directives in an aspect-oriented design tool.

Advantageously, in one or more embodiments, an abutted (soft) hierarchy removes obstacles from traditional planning and construction. Virtual large block partitions can use the entire metal stack without contracting wiring. Buffer and latch bays are not required to repeat signals during planning. One or more embodiments automate generation of construction components (for hLBS). "Abstracts" is a term used to describe the OpenAccess design data file that, in a non-limiting example, contains the physical design. As will be appreciated by the skilled artisan, OpenAccess is a proprietary API controlled by the OpenAccess Coalition that aims to facilitate interoperability of electronic design automation software among the members of that coalition. The pertinent details in one or more embodiments include the automated construction of the 1) place and route boundary which will be populated with ports (pins) obtained from the metal layers and positions from the global routing method discussed, and 2) the out of context timing assertions. Each these pieces of design data are used in one or more embodiments to build the physical design of the lower level pieces of hierarchy.

Furthermore, one or more instances automate feedthrough generation with a global perspective, enable power reduction through area reduction (by favoring high usage of hLBS), enable the physical design team to iterate on multiple design hierarchies without need for logic support, and/or enable alternate floorplan evaluation (physical design exploration).

One or more embodiments advantageously provide a system and/or method of automated design closure with abutted hierarchy wherein a continent aware, timing aware global router with track assignment is applied with cost penalties to avoid zig-zag routing; locations and sizes of pin assignment are taken from crossings of the global router; timing assertions are apportioned using pin positions from the global router; physical abstracts are generated using the pin assignment; and/or HDL is generated from abstracted physical content for a second level of hierarchy.

Further, in one or more embodiments, physical synthesis is executed on the continents to construct the physical design.

One or more embodiments include pushing down a subway buffer to cover the physical design hierarchy re-connection; and/or a method to plan feedthrough paths and regular paths, creating port assignment for large blocks.

One or more embodiments provide a method of achieving removal of excess ports (port crossing minimization).

Figure 13:
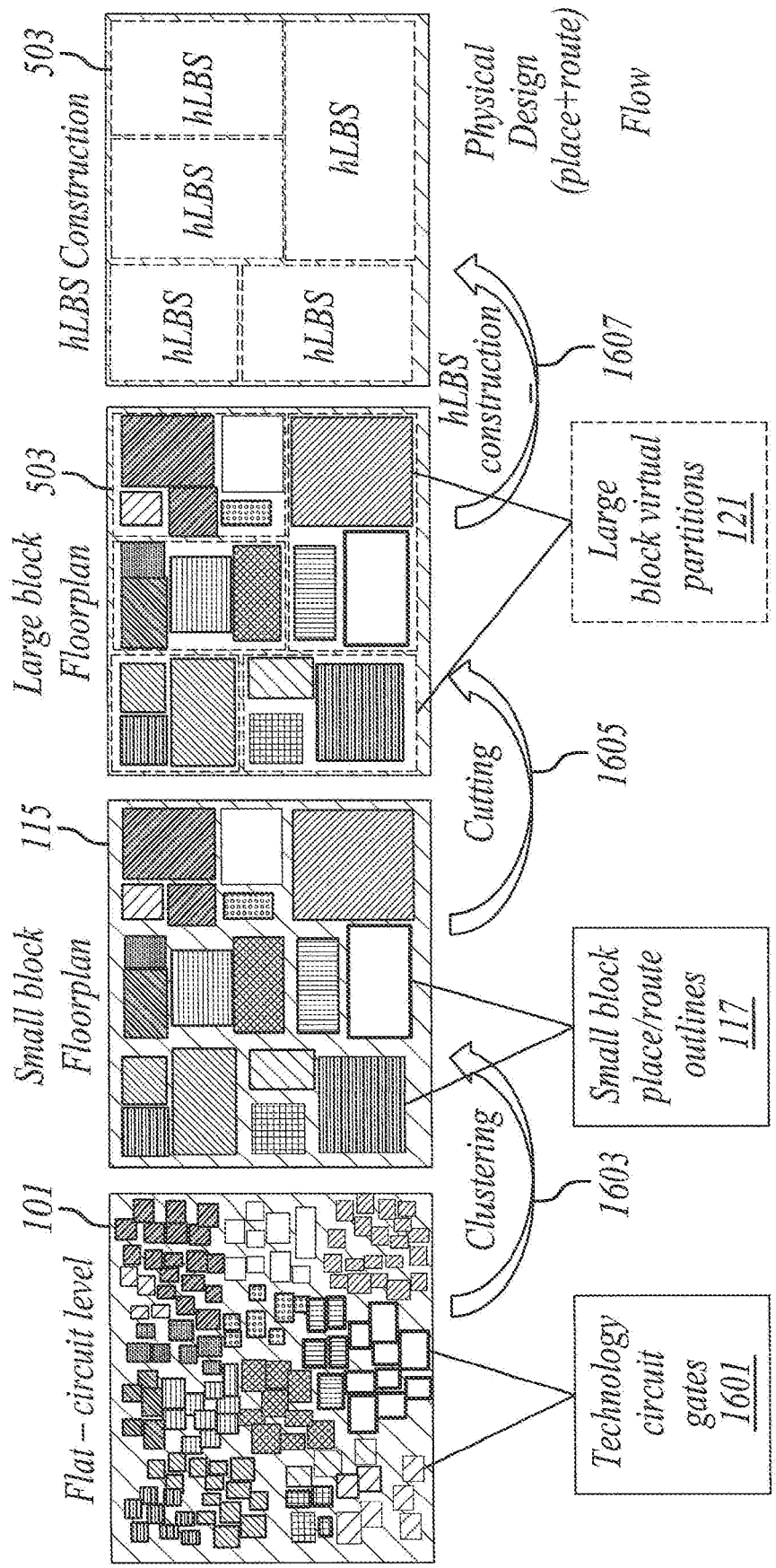
FIG. 13 shows small to large block floor planning to construction, according to an aspect of the invention.

FIG. 13 shows aspects of small to large block floor planning to construction. Core 101 includes technology circuit gates 1601. In clustering process 1603, small block floorplan 115, including small block place/route outlines 117, is produced. In cutting step 1605, large block floorplan 503 including large block virtual partitions 121, is produced.

In hLBS construction step 1607, the hLBS is carried out for each of the large blocks, followed by physical design (placement and routing) flow. The term hLBS refers to both the process of constructing the physical design and the way to refer to that corresponding level of hierarchy; the hLBS were the partitions (e.g. dashed-lines such as 121, 503) that are shown in earlier figures.

Furthermore with regard to timing assertion generation from partitions that have been created, one or more embodiments generate timing and electrical constraints such that the top-level timing is met if all partitions meet their timing constraints and feedthrough nets are always feasible to construct. Timing is propagated as usual on the hierarchical model, but adjustments are made as follows to make feedthrough nets feasible for construction. Arrival times propagate forward from primary inputs while required arrival times propagate backward from primary outputs. The slack is understood to be the required arrival time minus the arrival time at any given point. If a feedthrough net has a negative slack, then relax the arrival time and required arrival times proportionally across the partitions until a non-negative slack is reached. If a feedthrough net has positive slack, then distribute the slack among all crossed partitions; timing assertions are relaxed proportionally. For each port that crosses a partition, timing assertions are written out after being adjusted as described.

One or more embodiments make use of virtual timing, as defined by the delay for a given net based on the time of flight for a particular wire width on a particular metal layer in the given technology. Virtual timing is useful for estimating timing when the construction details are not available, for instance, the numbers of repeaters and actual placement locations to continue the signal that given distance from source to sink. However, other embodiments can use other timing models, e.g., Elmore delay.

Figure 14:
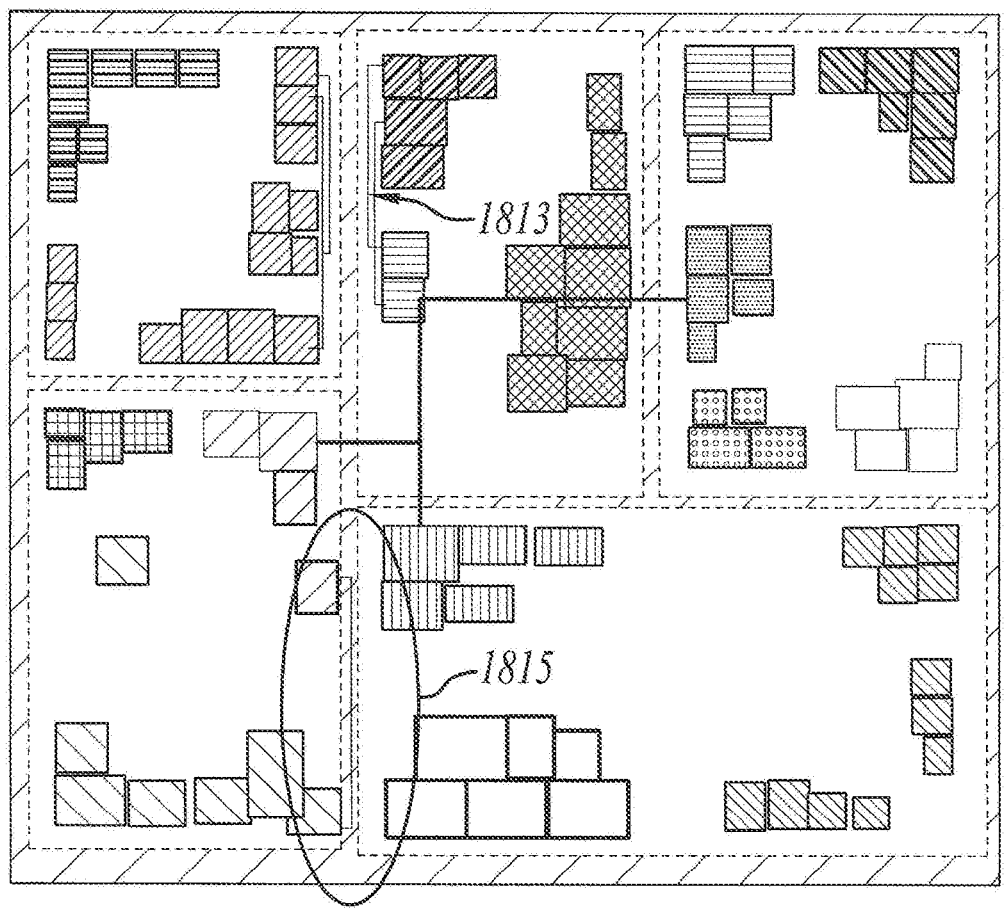
FIG. 14 shows prevention of incorrect subways via continent latch and dust logic set-back, according to an aspect of the invention.

Referring to FIG. 14, consider preventing incorrect subways via continent latch and dust logic set-back. Latch and dust logic are placed set-back from the edge of the partition boundary, to prevent an accidental incorrect subway from being produced. Note location 1813 where set-back is adequate and there is no issue, as well as location 1815 where an incorrect subway causes unneeded ports to be cut.

In one or more embodiments, select the port from the wire segment which crossed the edge of the virtual partition; the design is globally routed "flat," but seeing the virtual partitions such that they are not entered and exited multiple times (avoid "zig-zag"). From the global route, a track can be assigned for the wire segment that honors routing rules and fits between the power rails of the circuit row in which it passes. This is a pertinent concept in one or more embodiments because it is not necessary to move the port as a post process to enter detail routing; it is correct-by-construction. In one or more embodiments, after the virtual partitions have port locations with metal layers identified, a set of instructions are generated for another tool (aspect-oriented design tool as discussed) which will post process this result. In one or more embodiments, from generated directives (move/pclone statements), it is possible to produce a high-level design language that represents the large block partitions without the physical aspect of the design. This is a form of back-annotating the physical hierarchy to produce a new logical hierarchy which can be further processed with physical information to construct the layout of a microprocessor. One or more embodiments produce a back-annotated instruction to produce a new logical design from the cut-out section of the physical design. One or more embodiments provide a special global routing which avoids zig-zagging.

In one or more embodiments, global routing takes timing constraints into account as well as congestion.

One or more embodiments provide a global router with track assignment to identify feedthrough paths and planning of the port locations and metal layers which intersect the virtual partitions of a physical design. One or more embodiments provide a method to identify locations of ports on the "given" physical hierarchy and a method of back-annotating the physical ports to a new logical hierarchy. One or more embodiments create directives which move logic to another hierarchy and create logical ports, thereby creating a new logical hierarchy based on the pushed down physical aspects; a new HDL (VHDL, Verilog, etc.) is written.

One or more embodiments use abutted hierarchy and provide an automated methodology for construction of the hierarchical elements, such that ports are assigned to achieve routing and timing goals, signals are fed through efficiently to parts of the hierarchy (no in/out (no zig/zag)) and timing assertions are constructed to place and route the new hierarchical elements. In one or more embodiments, based on the small block floorplan as input, establish large block partitions enclosing small blocks. Execute a large partition (continent) aware, timing aware, congestion driven global router, with track assignment, to route nets communicating between small blocks. Identify the locations and sizes of wires crossing the large partition boundaries (new pin locations). Generate a new physical partition with those pin locations and sizes. Generate an HDL description of each new physical partition based on enclosed small block locations and pins. Generate timing assertions at pin assignments from top-level timing assertions.

The use of abutted hierarchy with an automated methodology to create a new abutted hierarchy with port assignment, feed-through generation alleviates the difficulty of manual contract management, and is different from the traditional method of contract management performed today with hard boundaries. The abutted hierarchies become less hard, giving flexibility to the designers.

One or more embodiments employ a virtual partition-aware (continent-aware), timing constrained, global router with track assignment to enable port creation on virtual partitions with cost-penalization, preventing duplicate crossings of partitions (zig-zag routing). The virtual partitions (move bounds) identify where ports are established on boundaries for producing new HDL for abutted hierarchy and are used to traverse the timing graph to produce timing assertions.

Partition-aware global routing is pertinent in one or more embodiments, including avoiding zig-zags, discouraging "short" subways, and providing "guidance" to avoid continents (a/k/a virtual partitions). Indeed, in one or more embodiments, the router is continent-aware: zig-zags and sharp subways are discouraged, continents are avoided, and certain paths are followed.

Given the discussion thus far, it will be appreciated that an exemplary method for increasing the efficiency of electronic design automation, according to an aspect of the invention, includes, as per FIG. 12 step 1205, executing partition-aware global routing with track assignment on an electronic data structure including a small block floorplan of a putative integrated circuit design. The small block floorplan (see FIG. 8 element 117) is virtually partitioned into a proposed large block floorplan with a plurality of inter-large-block boundaries of a plurality of large blocks (see FIG. 8 element 503). Aspects of the invention advantageously automate the process of taking a flat design and discovering good partitions. Refer to FIG. 13 as well. One or more embodiments analyze small block placement with knowledge that it will be cut into partitions and not flat. The resulting circuit itself is improved in one or more embodiments—more compacted, having less white space, being more power efficient (shorter wires, fewer buffers), and the like. Prior art techniques typically lock the designer into a hierarchy; one or more embodiments make it easier to recompile/rebuild partitions. The design process is also improved in one or more embodiments—a chip of equal quality can be developed with fewer human designers and/or fewer computer resources, or a better chip can be obtained with the same number of human designers and/or computer resources.

Referring to operation 1207 of FIG. 12, a further step includes, based on results of the executing, determining locations (e.g. FIG. 8 element 531), on the inter-large-block boundaries, of a plurality of required ports corresponding to routes identified in the routing, as well as required sizes of the ports. An even further step, as per operation 1209 of FIG. 12, includes generating a physical partitioning based on the inter-large-block boundaries. Still further steps include aligning the ports with the inter-large-block boundaries; and, as per operation 1211 in FIG. 12, generating a hardware description language design structure encoding the physical partitioning.

One or more embodiments employ three aspects to transform small block hierarchy into large block hierarchy: (i) identify the proposed large block boundaries; (ii) whatever small blocks are then within a given large block are assigned to that large block; and (iii) identify the interconnects that cross the large block boundaries and transform into port locations. In one or more embodiments, start with a small block floorplan and develop a large block floorplan based on the locations on the small block floorplan.

In one or more embodiments, partition-aware global routing includes three aspects:

(i) Weighting to discourage excessive crossing of continent boundaries (cost function to prevent zig-zag).

Figure 15:
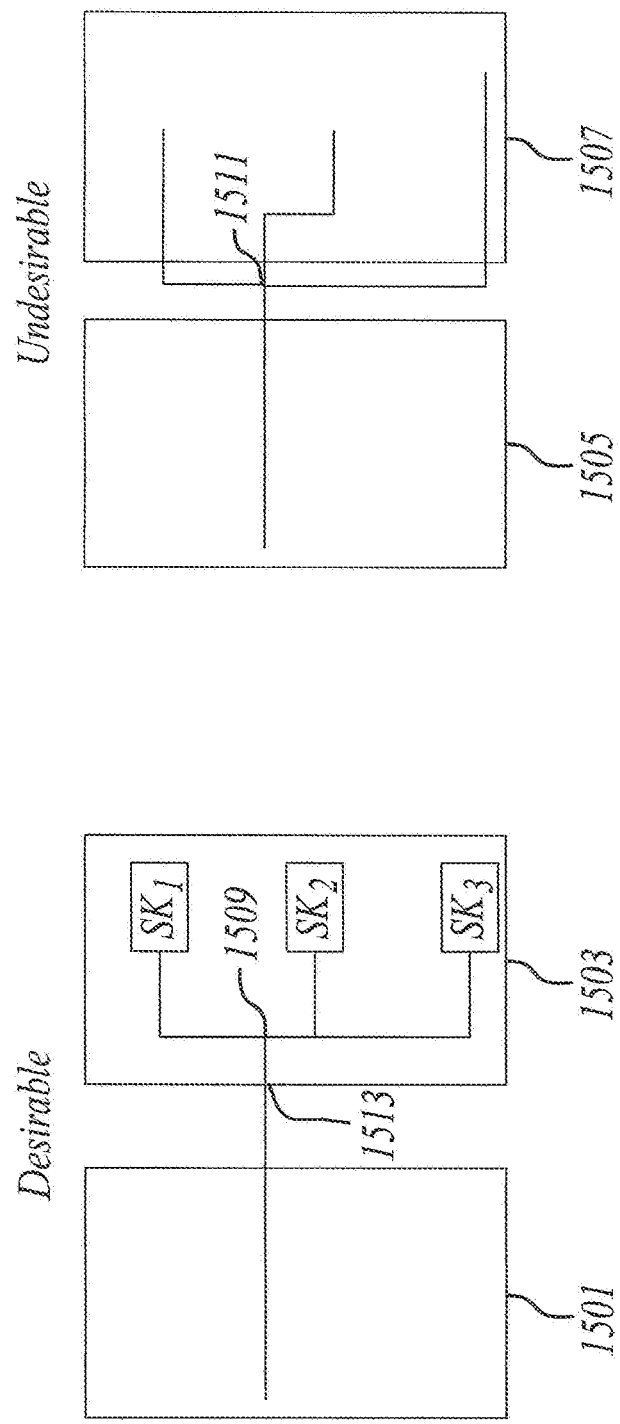
FIG. 15 shows generation of a single global crossing, according to an aspect of the invention.

(ii) Generation of one and only one global partition crossing (preferably with avoidance of zig-zagging as well on that one crossing). Refer to FIG. 15. One or more embodiments encourage the router to generate a pattern with only a single entry point. From the top-level routing topology, when a route needs to go from a first continent 1501 to a second continent 1503, generate one and only one global crossing. The left-hand side of FIG. 15 shows this desirable condition. The source in continent 1501 has a single branch to the sink continent 1503 and only divides at location 1509 within the sink continent. The right-hand side of FIG. 15 shows an undesirable condition, wherein branching at Steiner point 1511 takes place outside sink continent 1507 requiring more ports for routes between source continent 1505 and sink continent 1507. The Steiner-Dijkstra algorithm is discussed below.

A variety of techniques can be used to achieve the desirable result depicted in FIG. 15, minimizing the number of Steiner crossings at continent boundaries. In one or more embodiments, collapse all the sinks ($SK_1$, $SK_2$, $SK_3$) in the target continent to one point; for example, the centroid. Optionally, this centroid can be timing-weighted (a "single timing-weighted centroid point"). Route to the centroid, which results in a single global crossing, while inside the continent, the sinks are routed separately. To re-state, present only the single centroid point to the Steiner router, which will result in only a single crossing 1513. Then, redo the Steiner route from that single crossing to each of the sinks. The centroid can be determined by averaging the X coordinates of each sink and the Y coordinates of each sink, respectively, to obtain the X and Y coordinates for the centroid. As noted, in another option, the coordinates can be weighted; for example, if one sink is more timing-critical than the others, its coordinates could receive a higher weight.

Furthermore regarding point (ii), in one or more embodiments, insert a sub-root for each continent containing sinks, positioned at the projection of the source pin into the bounding box of the continent terminals. Project each sub-root as a sink into the closest continent on a path to the root. If this creates a sink in a previously empty continent, consider it a sub-root and project it as well. Compute a shortest path topology within each continent. The result is a topology that enters each continent at most once. This topology is embedded into the global routing graph using the so-called Steiner-Dijkstra algorithm with fixed topology and special continent boundary constraints that prevent zigzagging. The skilled artisan will be familiar with the Steiner-Dijkstra algorithm from, for example, Stefan Hougardy et al., Dijkstra meets Steiner: a fast exact goal-oriented Steiner tree algorithm, Mathematical Programming Computation, 2017 Jun. 1; 9(2):135-202.

(iii) Port Spreading. It is undesirable for the ports to be too close to each other; spreading is desirable from a general routability standpoint. Once the routes break into the continents, if it is desirable to use higher level layers of metal than what is assigned to the current port, it is desirable to be able to do this without creating a conflict with the neighboring port. In one or more embodiments, the global router will spread the ports (pins 515 in FIG. 6, e.g.) to minimize routing congestion. This ensures that there is sufficient space for each port near to the position where the global router placed it; simply spread the ports out locally. For example, based on the technology, establish a minimum port-to-port distance and ensure that each port has at least that much space, or divide the available perimeter on a boundary equally among all the ports.

Referring to operation 1213 of FIG. 12, in one or more embodiments, generate timing assertions at the port locations on the inter-large-block boundaries from top-level timing assertions. The latter can be established, for example, with global routing; run a hierarchical timer to determine the timing assertions. Pin assignments are also referred to herein as port locations.

In one or more embodiments, executing of the global routing includes applying a cost function to prevent zigzagging of the routes; constraining a Steiner branching point to lie within a target one of the large blocks (FIG. 15); and/or, for those of the inter-large-block boundaries having multiple ones of the ports, spreading the ports to minimize routing congestion.

One or more embodiments further include fabricating a physical integrated circuit in accordance with the design structure.

One or more embodiments further include making at least one design change to the putative circuit design based on the partition-aware global routing (and related steps as appropriate).

One or more embodiments further include updating the putative circuit design to reflect the at least one design change; and fabricating a physical integrated circuit in accordance with the updated circuit design.

Figure 17:
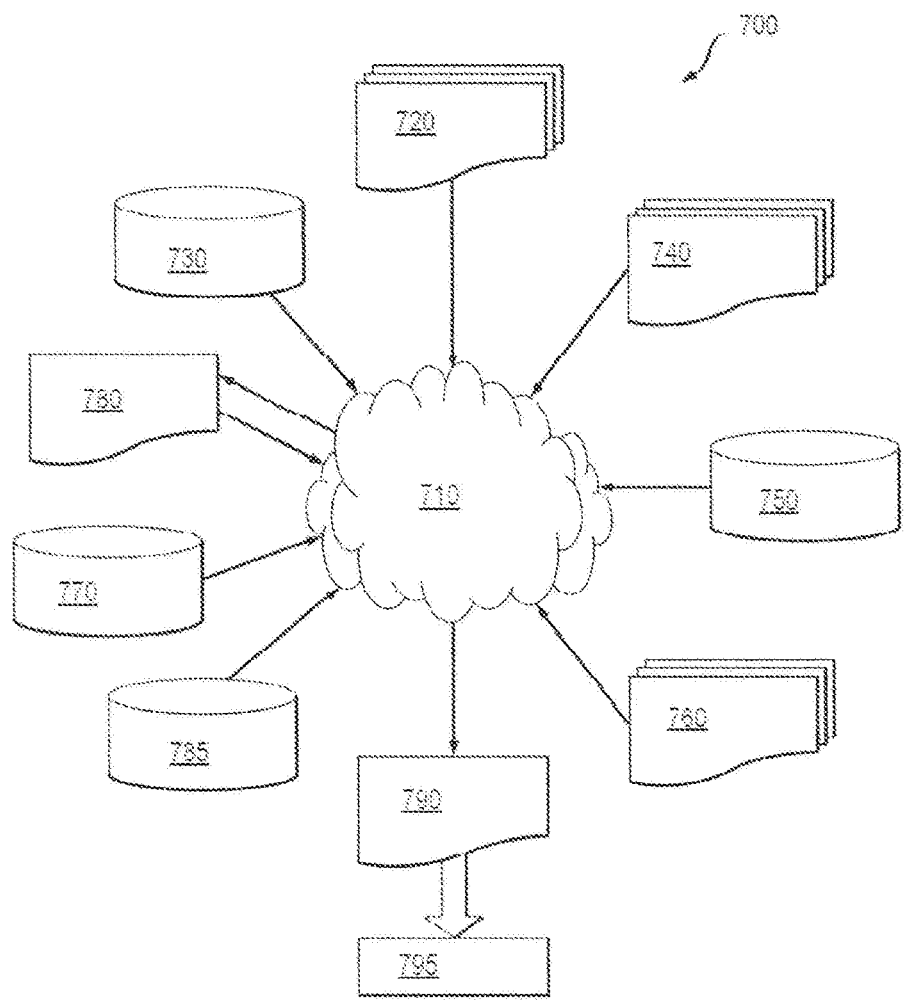
FIG. 17 is a flow diagram of a design process used in semiconductor design, manufacture, and/or test.
Figure 18:
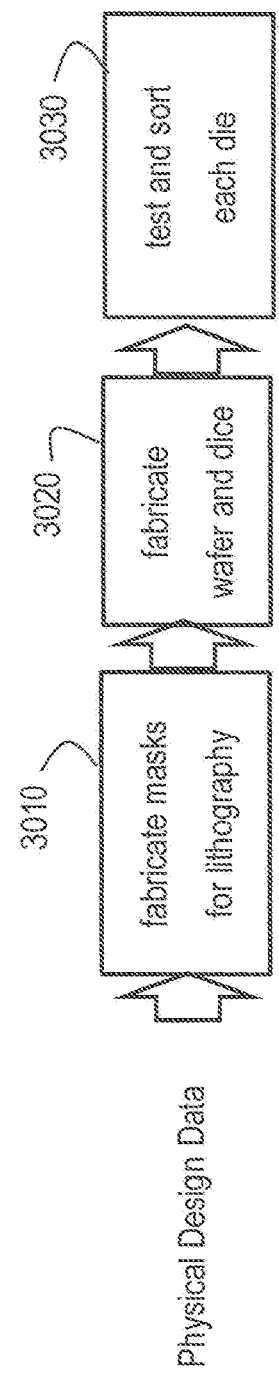
FIG. 18 shows further aspects of IC fabrication from physical design data.
Figure 19:
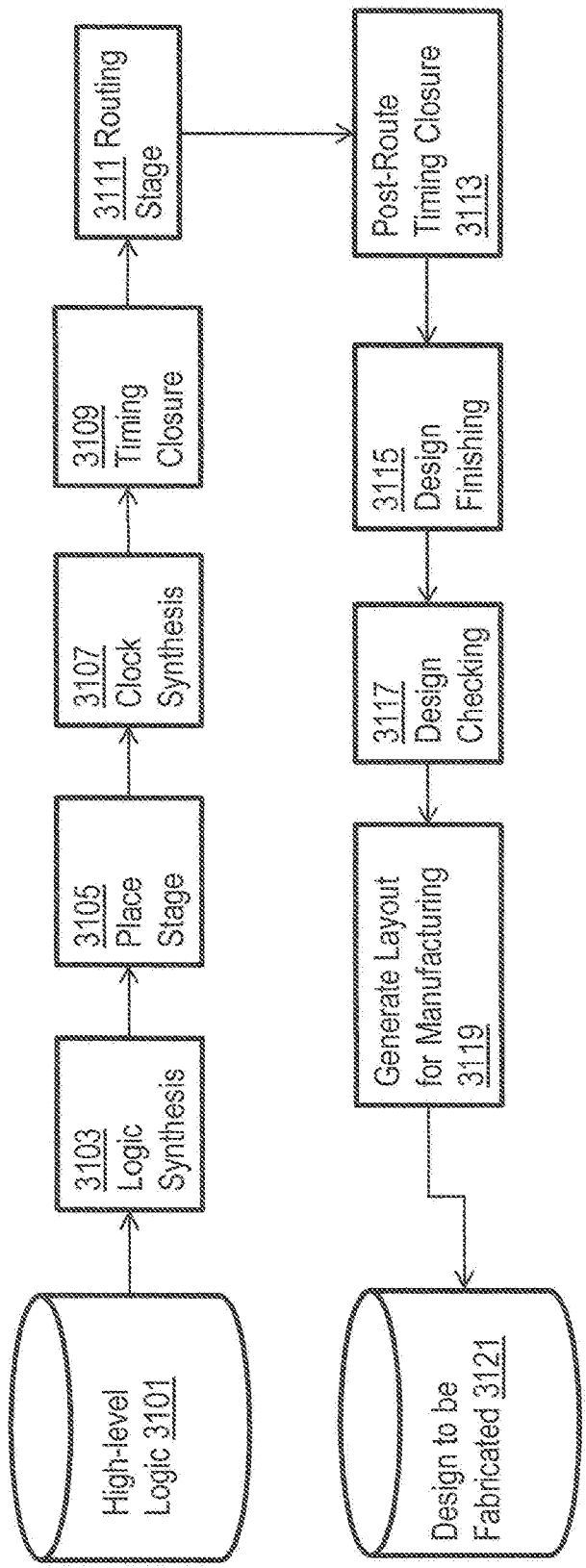
FIG. 19 shows an exemplary high-level Electronic Design Automation (EDA) tool flow, within which aspects of the invention can be employed.

For example, referring to FIGS. 17-19 discussed elsewhere herein, render the updated circuit design in design language; and prepare a layout based on the updated circuit design rendered in design language. Instantiate the layout as a design structure. The physical integrated circuit is then fabricated in accordance with the design structure.

Accordingly, in one or more embodiments, the layout is instantiated as a design structure. See discussion of FIG. 17. A physical integrated circuit is then fabricated in accordance with the design structure. See again discussion of FIG. 17. Refer also to FIG. 18. Once the physical design data is obtained, based, in part, on the analytical processes described herein, an integrated circuit designed in accordance therewith can be fabricated according to known processes that are generally described with reference to FIG. 18. Generally, a wafer with multiple copies of the final design is fabricated and cut (i.e., diced) such that each die is one copy of the integrated circuit. At block 3010, the processes include fabricating masks for lithography based on the finalized physical layout. At block 3020, fabricating the wafer includes using the masks to perform photolithography and etching. Once the wafer is diced, testing and sorting each die is performed at 3030 to filter out any faulty die.

One or more embodiments include a computer including a memory 28; and at least one processor 16, coupled to the memory, and operative to carry out or otherwise facilitate any one, some, or all of the method steps described herein (as depicted in FIG. 28). In one or more embodiments, the performance of this computer is improved, for example, by reducing the required number of CPU cycles by enabling a physical design (PD) team to iterate on multiple design hierarchies without need for logic support, and/or enabling alternate floorplan evaluation (physical design exploration).

Furthermore, referring to FIG. 10, in one or more embodiments the at least one processor is operative to generate a design structure for the circuit design in accordance with the analysis, and in at least some embodiments, the at least one processor is further operative to control integrated circuit manufacturing equipment to fabricate a physical integrated circuit in accordance with the design structure. Thus, the layout can be instantiated as a design structure, and the design structure can be provided to fabrication equipment to facilitate fabrication of a physical integrated circuit in accordance with the design structure. The physical integrated circuit will be improved (for example, because of enablement of power reduction through area reduction).

FIG. 19 depicts an example high-level Electronic Design Automation (EDA) tool flow, which is responsible for creating an optimized microprocessor (or other IC) design to be manufactured. A designer could start with a high-level logic description 3101 of the circuit (e.g. VHDL or Verilog). The logic synthesis tool 3103 compiles the logic, and optimizes it without any sense of its physical representation, and with estimated timing information. The placement tool 3105 takes the logical description and places each component, looking to minimize congestion in each area of the design. The clock synthesis tool 3107 optimizes the clock tree network by cloning/balancing/buffering the latches or registers. The timing closure step 3109 performs a number of optimizations on the design, including buffering, wire tuning, and circuit repowering; its goal is to produce a design which is routable, without timing violations, and without excess power consumption. The routing stage 3111 takes the placed/optimized design, and determines how to create wires to connect all of the components, without causing manufacturing violations. Post-route timing closure 3113 performs another set of optimizations to resolve any violations that are remaining after the routing. Design finishing 3115 then adds extra metal shapes to the netlist, to conform with manufacturing requirements. The checking steps 3117 analyze whether the design is violating any requirements such as manufacturing, timing, power, electromigration (e.g., using techniques disclosed herein) or noise. When the design is clean, the final step 3119 is to generate a layout for the design, representing all the shapes to be fabricated in the design to be fabricated 3121.

Figure 16:
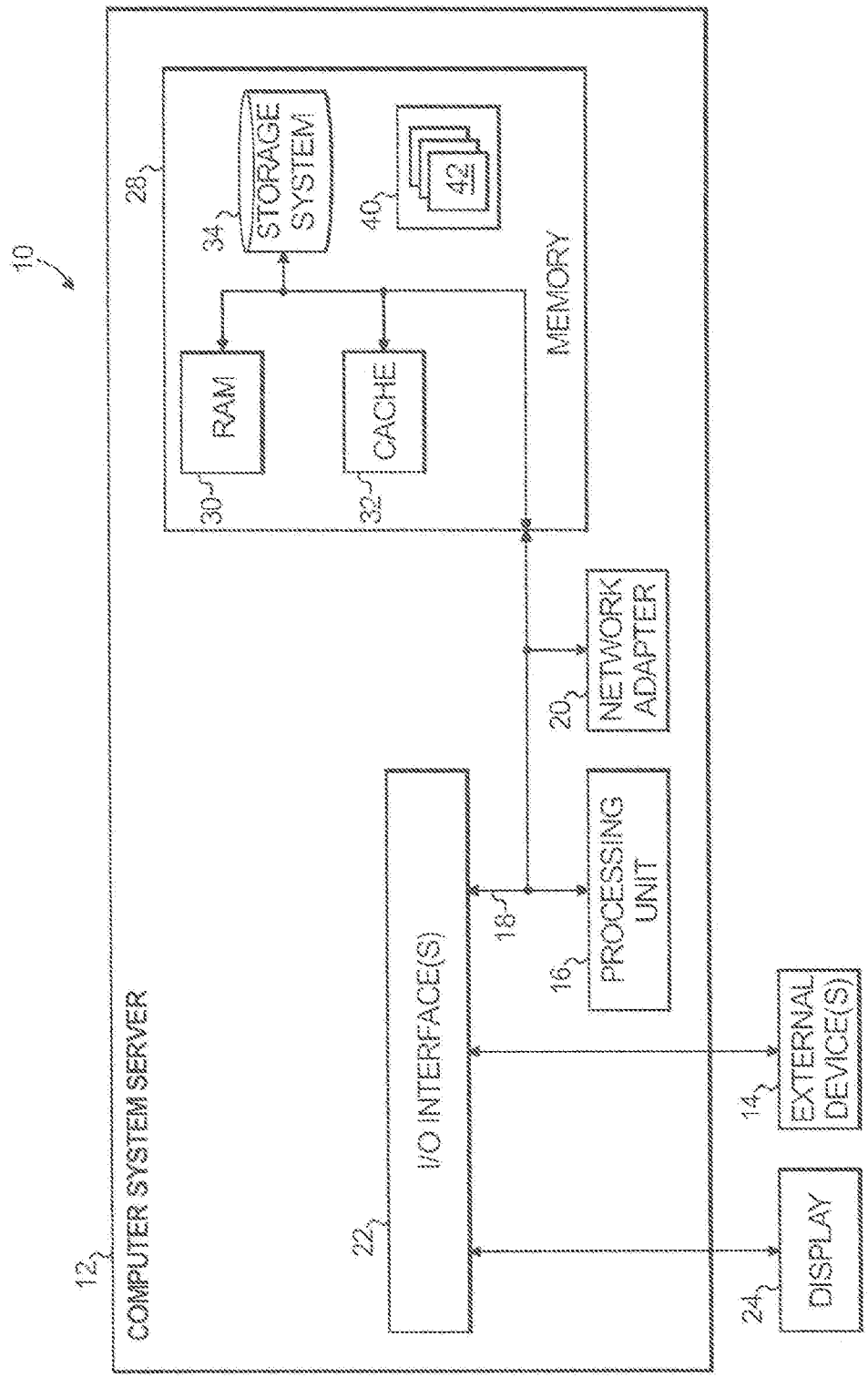
FIG. 16 depicts a computer system that may be useful in implementing one or more aspects and/or elements of the invention.

One or more embodiments of the invention, or elements thereof, can be implemented in the form of an apparatus including a memory and at least one processor that is coupled to the memory and operative to perform exemplary method steps. FIG. 16 depicts a computer system that may be useful in implementing one or more aspects and/or elements of the invention; it is referred to herein as a cloud computing node but is also representative of a server, general purpose-computer, etc. which may be provided in a cloud or locally.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 16, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, and external disk drive arrays, RAID systems, tape drives, and data archival storage systems, etc.

Thus, one or more embodiments can make use of software running on a general purpose computer or workstation. With reference to FIG. 16, such an implementation might employ, for example, a processor 16, a memory 28, and an input/output interface 22 to a display 24 and external device(s) 14 such as a keyboard, a pointing device, or the like. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory) 30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 16) running a server program. It will be understood that such a physical server may or may not include a display and keyboard.

It should be noted that any of the methods described herein can include an additional step of providing a system comprising distinct software modules embodied on a computer readable storage medium; the modules can include, for example, any or all of the appropriate elements depicted in the block diagrams and/or described herein; by way of example and not limitation, any one, some or all of the modules/blocks and or sub-modules/sub-blocks described. The method steps can then be carried out using the distinct software modules and/or sub-modules of the system, as described above, executing on one or more hardware processors such as 16. Further, a computer program product can include a computer-readable storage medium with code adapted to be implemented to carry out one or more method steps described herein, including the provision of the system with the distinct software modules.

One example of user interface that could be employed in some cases is hypertext markup language (HTML) code served out by a server or the like, to a browser of a computing device of a user. The HTML is parsed by the browser on the user's computing device to create a graphical user interface (GUI).

Exemplary System and Article of Manufacture Details

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Exemplary Design Process Used in Semiconductor Design, Manufacture, and/or Test

One or more embodiments integrate the characterizing and simulating techniques herein with semiconductor integrated circuit design simulation, test, layout, and/or manufacture. In this regard, FIG. 10 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those that can be analyzed using techniques disclosed herein or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc. Improved latch tree synthesis can be performed as described herein.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 790 may comprise a compiled, executable HDL simulation model that functionally simulates the devices to be analyzed.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., .lib files). Design structure 790 may then proceed to a stage 795 where, for example, design structure 790: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for increasing the efficiency of electronic design automation, the method comprising:
    executing partition-aware global routing with track assignment on an electronic data structure comprising a small block floorplan of a putative integrated circuit design, the small block floorplan being virtually partitioned into a proposed large block floorplan with a plurality of inter-large-block boundaries of a plurality of large blocks, wherein a high cost is assigned to a route that crosses a same border twice and wherein said executing of said global routing includes applying a cost function that utilizes said assigned high cost to prevent zig-zagging of routes;
    based on results of said executing, determining locations, on said inter-large-block boundaries, of a plurality of required ports corresponding to routes identified in said routing, as well as required sizes of said ports;
    generating a physical partitioning based on said inter-large-block boundaries;
    aligning said ports with said inter-large-block boundaries; and
    generating a hardware description language design structure encoding said physical partitioning.

2. The method of claim 1, further comprising generating timing assertions at said port locations on said inter-large-block boundaries from top-level timing assertions.

3. The method of claim 2, wherein said executing of said global routing includes constraining a Steiner branching point to lie within a target one of said large blocks.

4. The method of claim 3, wherein said executing of said global routing includes, for those of said inter-large-block boundaries having multiple ones of said ports, spreading said ports to minimize routing congestion.

5. The method of claim 2, wherein said executing of said global routing includes, for those of said inter-large-block boundaries having multiple ones of said ports, spreading said ports to minimize routing congestion.

6. The method of claim 1, wherein said executing of said global routing includes constraining a Steiner branching point to lie within a target one of said large blocks.

7. The method of claim 6, wherein said executing of said global routing includes, for those of said inter-large-block boundaries having multiple ones of said ports, spreading said ports to minimize routing congestion.

8. The method of claim 1, further comprising fabricating a physical integrated circuit in accordance with said design structure.

9. A computer comprising:
a memory; and
at least one processor, coupled to said memory, and operative to increase the efficiency of electronic design automation by:
executing partition-aware global routing with track assignment on an electronic data structure comprising a small block floorplan of a putative integrated circuit design, the small block floorplan being virtually partitioned into a proposed large block floorplan with a plurality of inter-large-block boundaries of a plurality of large blocks, wherein a high cost is assigned to a route that crosses a same border twice and wherein said executing of said global routing includes applying a cost function that utilizes said assigned high cost to prevent zig-zagging of routes;
based on results of said executing, determining locations, on said inter-large-block boundaries, of a plurality of required ports corresponding to routes identified in said routing, as well as required sizes of said ports;
generating a physical partitioning based on said inter-large-block boundaries;
aligning said ports with said inter-large-block boundaries; and
generating a hardware description language design structure encoding said physical partitioning.

10. The computer of claim 9, further comprising generating timing assertions at said port locations on said inter-large-block boundaries from top-level timing assertions.

11. The computer of claim 9, wherein said executing of said global routing includes constraining a Steiner branching point to lie within a target one of said large blocks.

12. The computer of claim 11, wherein said executing of said global routing includes, for those of said inter-large-block boundaries having multiple ones of said ports, spreading said ports to minimize routing congestion.

13. The computer of claim 9, wherein said at least one processor is further operative to increase the efficiency of the electronic design automation by providing said design structure to fabrication equipment to facilitate fabrication of a physical integrated circuit in accordance with said design structure.

14. A non-transitory computer readable medium comprising computer executable instructions which when executed by a computer performing electronic design automation cause the computer to perform a method which increases the efficiency of the electronic design automation, the method comprising:
executing partition-aware global routing with track assignment on an electronic data structure comprising a small block floorplan of a putative integrated circuit design, the small block floorplan being virtually partitioned into a proposed large block floorplan with a plurality of inter-large-block boundaries of a plurality of large blocks, wherein a high cost is assigned to a route that crosses a same border twice and wherein said executing of said global routing includes applying a cost function that utilizes said assigned high cost to prevent zig-zagging of routes;
based on results of said executing, determining locations, on said inter-large-block boundaries, of a plurality of required ports corresponding to routes identified in said routing, as well as required sizes of said ports;
generating a physical partitioning based on said inter-large-block boundaries;
aligning said ports with said inter-large-block boundaries; and
generating a hardware description language design structure encoding said physical partitioning.

15. The non-transitory computer readable medium of claim 14, wherein said method further comprises generating timing assertions at said port locations on said inter-large-block boundaries from top-level timing assertions.

16. The non-transitory computer readable medium of claim 14, wherein said executing of said global routing includes constraining a Steiner branching point to lie within a target one of said large blocks.

17. The non-transitory computer readable medium of claim 16, wherein said executing of said global routing includes, for those of said inter-large-block boundaries having multiple ones of said ports, spreading said ports to minimize routing congestion.

* * * * *